(12) United States Patent
Wu et al.

(10) Patent No.: US 12,114,498 B2
(45) Date of Patent: Oct. 8, 2024

(54) THREE-DIMENSIONAL MEMORY DEVICES

(71) Applicant: YANGTZE MEMORY TECHNOLOGIES CO., LTD., Wuhan (CN)

(72) Inventors: Linchun Wu, Wuhan (CN); Kun Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 274 days.

(21) Appl. No.: 16/920,218

(22) Filed: Jul. 2, 2020

(65) Prior Publication Data
US 2021/0320120 A1    Oct. 14, 2021

Related U.S. Application Data

(63) Continuation of application No. PCT/CN2020/092512, filed on May 27, 2020.

(30) Foreign Application Priority Data

Apr. 14, 2020    (WO) ................ PCT/CN2020/084600
Apr. 14, 2020    (WO) ................ PCT/CN2020/084603
(Continued)

(51) Int. Cl.
*H01L 23/48*    (2006.01)
*H01L 21/48*    (2006.01)
(Continued)

(52) U.S. Cl.
CPC ........ *H10B 43/27* (2023.02); *H01L 21/30604* (2013.01); *H01L 21/30625* (2013.01)

(58) Field of Classification Search
CPC ........... H01L 27/1157; H01L 27/11582; H01L 21/02532; H01L 21/02576;
(Continued)

(56) References Cited

U.S. PATENT DOCUMENTS 9,460,931 B2    10/2016    Pachamuthu et al.
9,478,495 B1 *    10/2016    Pachamuthu ......... H01L 23/485
(Continued)

FOREIGN PATENT DOCUMENTS

CN    104520992 A    4/2015
CN    107425005 A    12/2017
(Continued)

OTHER PUBLICATIONS

International Search Report issued in corresponding International Application No. PCT/CN2020/092512, mailed Jan. 12, 2021, 4 pages.

*Primary Examiner* — Mary A Wilczewski
*Assistant Examiner* — Tsz K Chiu
(74) *Attorney, Agent, or Firm* — BAYES PLLC

(57) ABSTRACT

Embodiments of 3D memory devices and methods for forming the same are disclosed. In an example, a 3D memory device includes a stop layer, a polysilicon layer, a memory stack including interleaved stack conductive layers and stack dielectric layers, and a plurality of channel structures each extending vertically through the memory stack and the polysilicon layer, stopping at the stop layer.

17 Claims, 18 Drawing Sheets

(30) Foreign Application Priority Data

Apr. 27, 2020 (WO) ................ PCT/CN2020/087295
Apr. 27, 2020 (WO) ................ PCT/CN2020/087296

(51) Int. Cl.
*H10B 43/27* (2023.01)
*H01L 21/306* (2006.01)

(58) Field of Classification Search
CPC ........... H01L 21/02595; H01L 29/7808; H01L 29/7802; H01L 29/66712; H01L 29/788; H01L 29/42324; H01L 29/66825; H01L 29/792; H01L 2924/13081; H01L 2924/13085; H01L 29/6684; H01L 29/78391; H01L 29/4236; H10B 20/40; H10B 41/00
See application file for complete search history.

(56) References Cited

U.S. PATENT DOCUMENTS

| | | | |
|---|---|---|---|
| 9,837,349 B2 | 12/2017 | Song et al. | |
| 9,997,534 B2* | 6/2018 | Son | H01L 23/528 |
| 10,020,363 B2* | 7/2018 | Ogawa | H10B 43/35 |
| 10,224,340 B2* | 3/2019 | Hada | H10B 41/27 |
| 10,269,820 B1* | 4/2019 | Kaminaga | H01L 27/11582 |
| 10,424,590 B2 | 9/2019 | Lee | |
| 10,490,565 B1* | 11/2019 | Arisumi | H10B 41/30 |
| 10,535,677 B2* | 1/2020 | Oshiki | H01L 21/76805 |
| 10,559,591 B2 | 2/2020 | Kanamori et al. | |
| 10,665,607 B1* | 5/2020 | Sugiura | H01L 23/5226 |
| 10,930,665 B2* | 2/2021 | Horibe | H01L 27/11565 |
| 2010/0155810 A1* | 6/2010 | Kim | H10B 41/27 257/316 |
| 2013/0065386 A1 | 3/2013 | Kim et al. | |
| 2014/0167131 A1 | 6/2014 | Lu et al. | |
| 2014/0339621 A1* | 11/2014 | Simsek-Ege | H01L 29/42332 438/588 |
| 2015/0243671 A1* | 8/2015 | Simsek-Ege | H01L 27/11582 257/321 |
| 2017/0338241 A1* | 11/2017 | Lee | H01L 29/792 |
| 2018/0122904 A1* | 5/2018 | Matsumoto | H01L 27/11573 |
| 2018/0122905 A1* | 5/2018 | Ogawa | H01L 27/11582 |
| 2019/0081065 A1* | 3/2019 | Lee | H01L 27/11575 |
| 2019/0326313 A1* | 10/2019 | Cui | H01L 27/1157 |
| 2019/0333931 A1* | 10/2019 | Jung | H01L 27/11524 |
| 2020/0227439 A1* | 7/2020 | Sato | H01L 27/1159 |
| 2020/0350326 A1* | 11/2020 | Yun | H01L 27/11575 |
| 2021/0320115 A1* | 10/2021 | Wu | H10B 41/27 |
| 2021/0320120 A1* | 10/2021 | Wu | H01L 27/11582 |
| 2021/0320121 A1* | 10/2021 | Wu | H01L 27/1157 |
| 2021/0335808 A1* | 10/2021 | Wu | H01L 27/11582 |
| 2022/0037234 A1* | 2/2022 | Wu | H10B 43/40 |
| 2022/0130854 A1* | 4/2022 | Kong | H10B 43/27 |

FOREIGN PATENT DOCUMENTS

| | | |
|---|---|---|
| CN | 110785851 A | 2/2019 |
| CN | 109727990 A | 5/2019 |
| CN | 109742081 A | 5/2019 |
| CN | 109786387 A | 5/2019 |
| CN | 109817633 A | 5/2019 |
| CN | 109904170 A | 6/2019 |
| CN | 110034124 A | 7/2019 |
| CN | 110676258 A | 1/2020 |
| CN | 110767655 A | 2/2020 |

* cited by examiner

THREE-DIMENSIONAL MEMORY DEVICES

CROSS-REFERENCE TO RELATED APPLICATIONS

This application is a continuation of International Application No. PCT/CN2020/092512, filed on May 27, 2020, entitled "THREE-DIMENSIONAL MEMORY DEVICES," which is hereby incorporated by reference in its entirety. This application claims the benefit of priorities to International Application No. PCT/CN2020/084600, filed on Apr. 14, 2020, entitled "THREE-DIMENSIONAL MEMORY DEVICE WITH BACKSIDE SOURCE CONTACT," International Application No. PCT/CN2020/084603, filed on Apr. 14, 2020, entitled "METHOD FOR FORMING THREE-DIMENSIONAL MEMORY DEVICE WITH BACKSIDE SOURCE CONTACT," International Application No. PCT/CN2020/087295, filed on Apr. 27, 2020, entitled "THREE-DIMENSIONAL MEMORY DEVICE AND METHOD FOR FORMING THE SAME," and International Application No. PCT/CN2020/087296, filed on Apr. 27, 2020, entitled "THREE-DIMENSIONAL MEMORY DEVICE AND METHOD FOR FORMING THE SAME," all of which are incorporated herein by reference in their entireties. This application is also related to U.S. application Ser. No. 16/920,229, filed on Jul. 2, 2020 entitled "METHODS FOR FORMING THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a stop layer, a polysilicon layer, a memory stack including interleaved stack conductive layers and stack dielectric layers, and a plurality of channel structures each extending vertically through the memory stack and the polysilicon layer, stopping at the stop layer.

In another example, a 3D memory device includes a polysilicon layer, a memory stack including interleaved stack conductive layers and stack dielectric layers, and a plurality of channel structures each extending vertically through the memory stack and the polysilicon layer. Each of the plurality of channel structures includes a memory film and a semiconductor channel Part of the semiconductor channel along a sidewall of the channel structure is in contact with a sublayer of the polysilicon layer. The 3D memory device further includes an insulating structure extending vertically through the memory stack into the polysilicon layer, stopping at the sublayer of the polysilicon layer.

In still another example, a 3D memory device includes a polysilicon layer, a memory stack including interleaved stack conductive layers and stack dielectric layers, and a plurality of channel structures each extending vertically through the memory stack and the polysilicon layer. Each of the plurality of channel structures includes a memory film and a semiconductor channel. Part of the semiconductor channel along a sidewall of the channel structure is in contact with a sublayer of the polysilicon layer. The 3D memory device further includes a source contact structure extending vertically through the memory stack into the polysilicon layer, stopping at the sublayer of the polysilicon layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
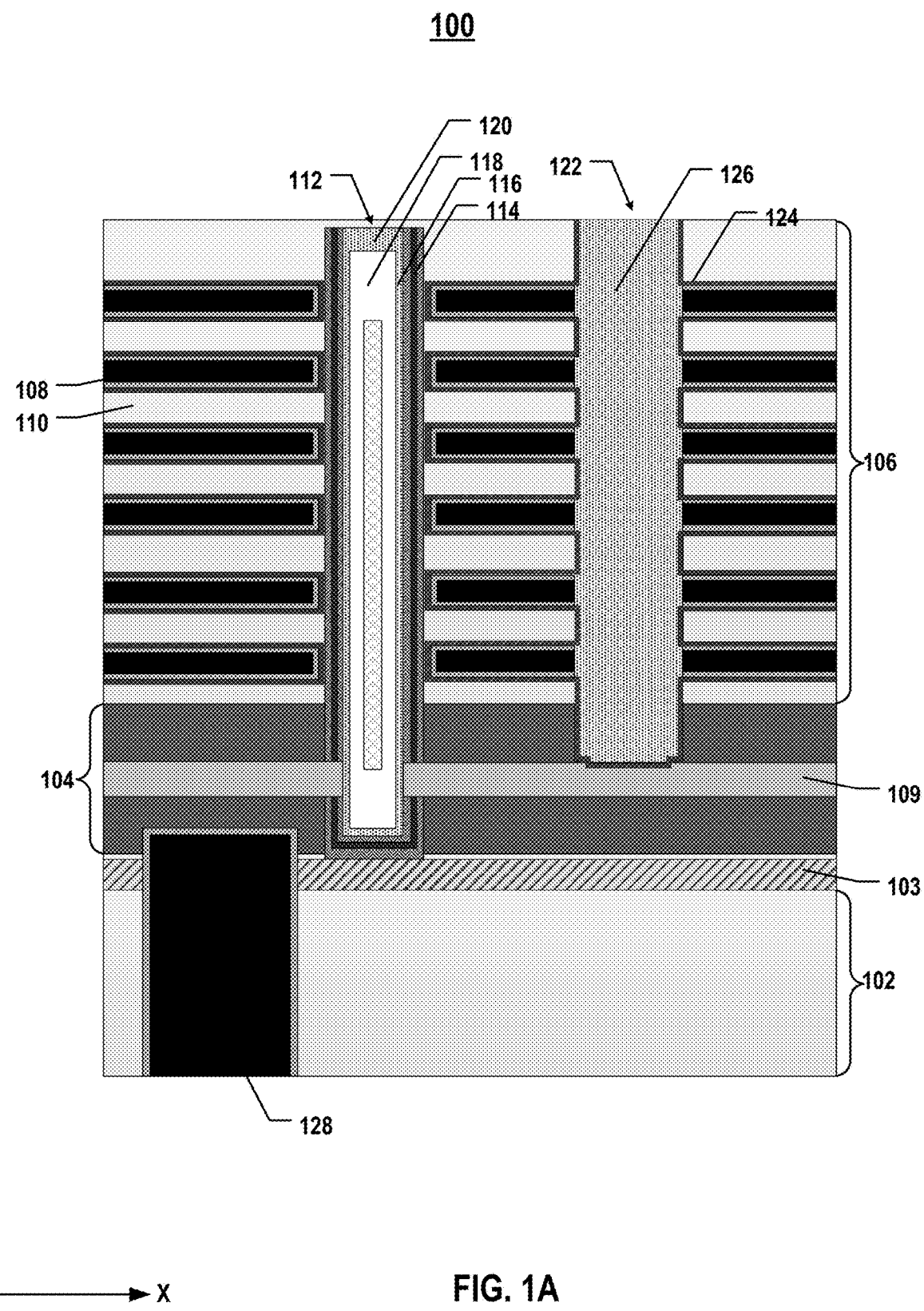
FIGS. 1A-1E illustrate side views of cross-sections of various exemplary 3D memory devices, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture. Moreover, the sidewall SEG structure can be combined with backside processes to form source contacts from the backside of the substrate to avoid leakage current and parasitic capacitance between front side source contacts and word lines and increase the effective device area.

However, since the backside processes require thinning the substrate, it faces two major challenges: the thickness uniformity is difficult to control at the wafer level in the thinning process, and the deep, high concentration doping in the thinned substrate (e.g., with the thickness greater than 1 µm) is hard to achieve. These challenges limit the production yield of the 3D NAND memory devices with sidewall SEG structure and backside processes.

Various embodiments in accordance with the present disclosure provide improved 3D memory devices and fabrication methods thereof. A stop layer can be formed on the substrate to automatically stop the backside thinning process, such that the substrate can be completely removed to avoid the wafer thickness uniformity control issue and reduce the fabrication complexity of the backside processes. In some embodiments, the same stop layer or another stop layer is used to automatically stop the channel hole etching, which can better control the gouging variation between different channel structures and further increase the backside process window. Moreover, deposited polysilicon layer(s) can replace single crystalline silicon in the removed silicon substrate to be used as the sidewall SEG. As the deposited polysilicon layer(s) can be more easily doped to achieve the desired doping concentration than the thinned silicon substrate, the backside process complexity can be further reduced, and the production yield can be increased.

FIGS. 1A-1E illustrate side views of cross-sections of various exemplary 3D memory devices, according to various embodiments of the present disclosure. In some embodiments, a 3D memory device 100 in FIG. 1A includes a substrate (not shown), which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof. It is noted that x and y axes are included in FIG. 1A to further illustrate the spatial relationship of the components in 3D memory device 100. The substrate of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device in the y-direction (i.e., the vertical direction) when the substrate is positioned in the lowest plane of the 3D memory device in the y-direction. The same notion for describing the spatial relationships is applied throughout the present disclosure.

In some embodiments, 3D memory device 100 is part of a non-monolithic 3D memory device, in which the components are formed separately on different substrates and then bonded in a face-to-face manner, a face-to-back manner, or a back-to-back manner Peripheral devices (not shown), such as any suitable digital, analog, and/or mixed-signal peripheral circuits used for facilitating the operation of 3D memory device 100, can be formed on a separate peripheral device substrate different from the memory array substrate on which the components shown in FIG. 1A are formed. It is understood that the memory array substrate may be removed from 3D memory device 100 as described below in detail, and the peripheral device substrate may become the substrate of 3D memory device 100. It is further understood that depending on the way how the peripheral device substrate and the memory array device substrate are bonded, the memory array devices (e.g., shown in FIG. 1A) may be in the original positions or may be flipped upside down in 3D memory device 100. For ease of reference, FIG. 1A depicts a state of 3D memory device 100 in which the memory array devices are in the original positions (i.e., not flipped upside down). However, it is understood that in some examples, the memory array devices shown in FIG. 1A may be flipped upside down in 3D memory device 100, and their relative positions may be changed accordingly. The same notion for describing the spatial relationships is applied throughout the present disclosure.

Figure 3A:
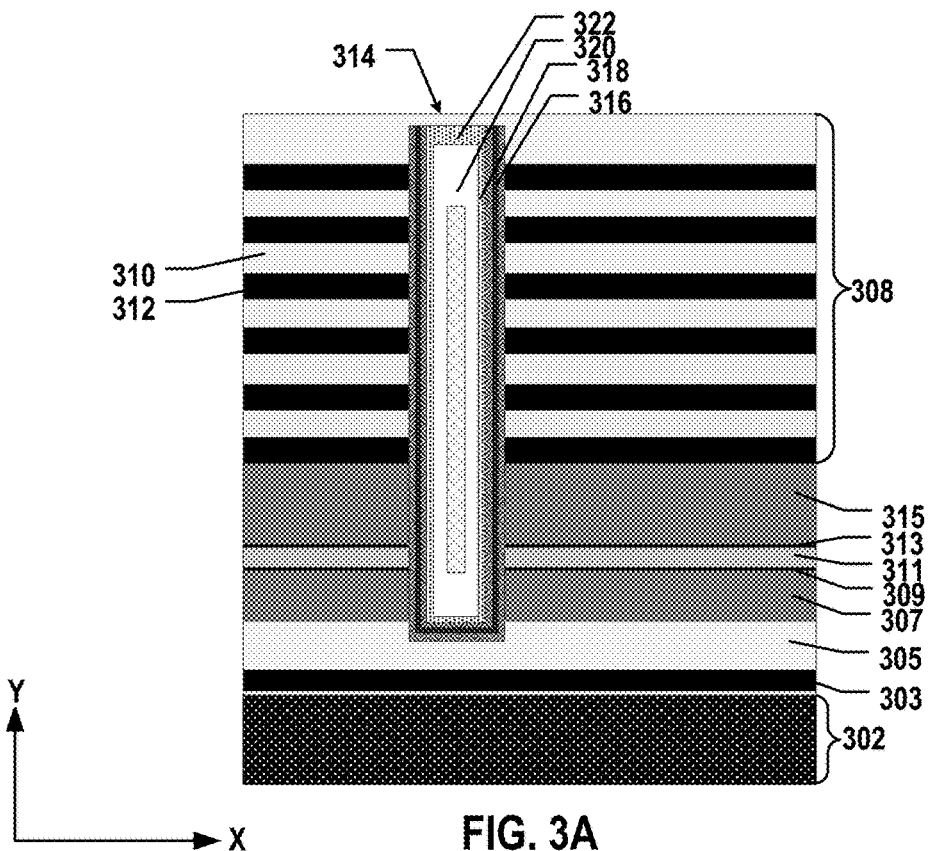
FIGS. 3A-3J illustrate a fabrication process for forming another exemplary 3D memory device, according to some embodiments of the present disclosure.
Figure 3B:
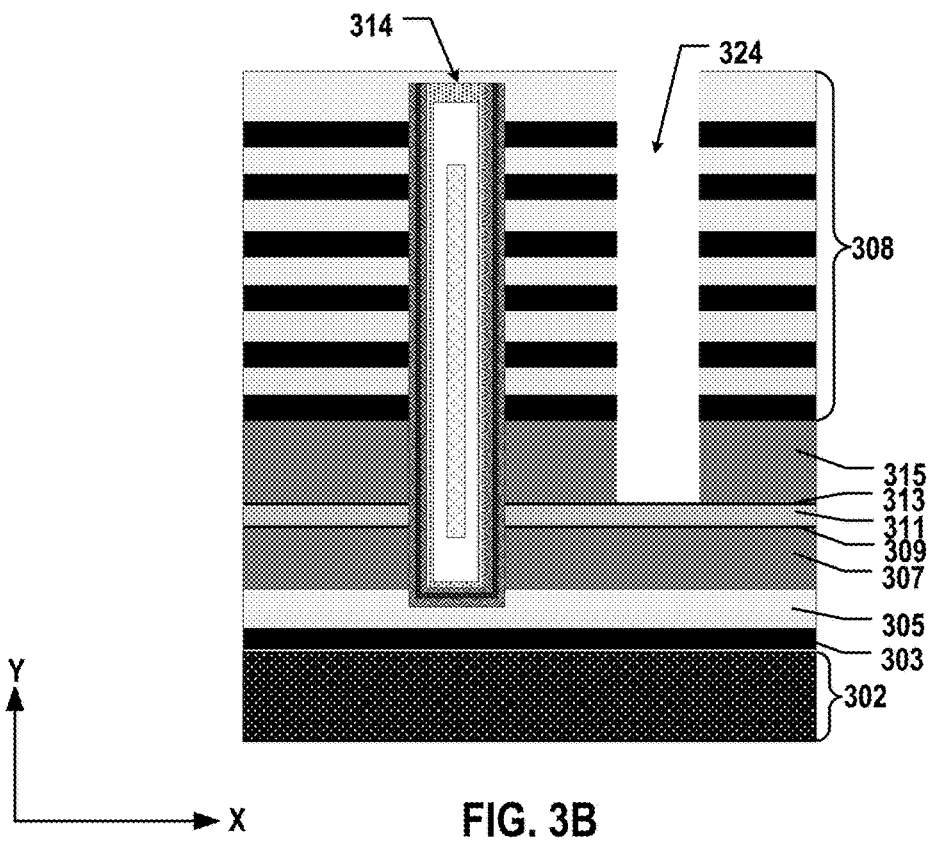
Figure 3C:
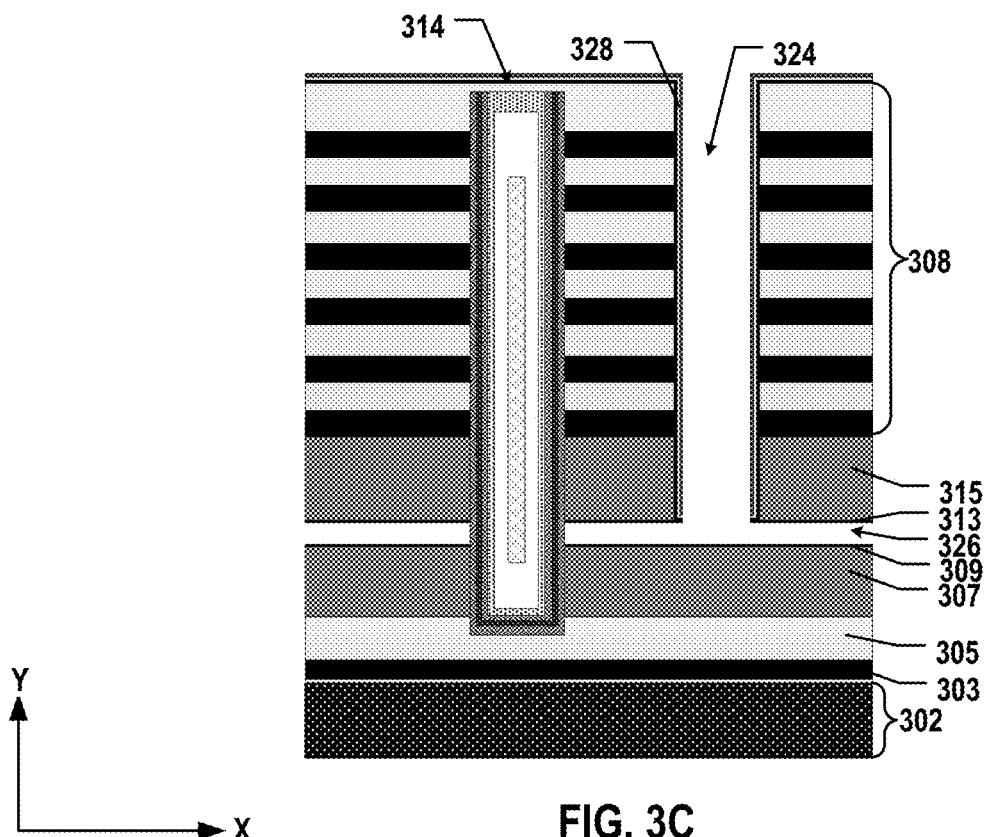
Figure 3D:
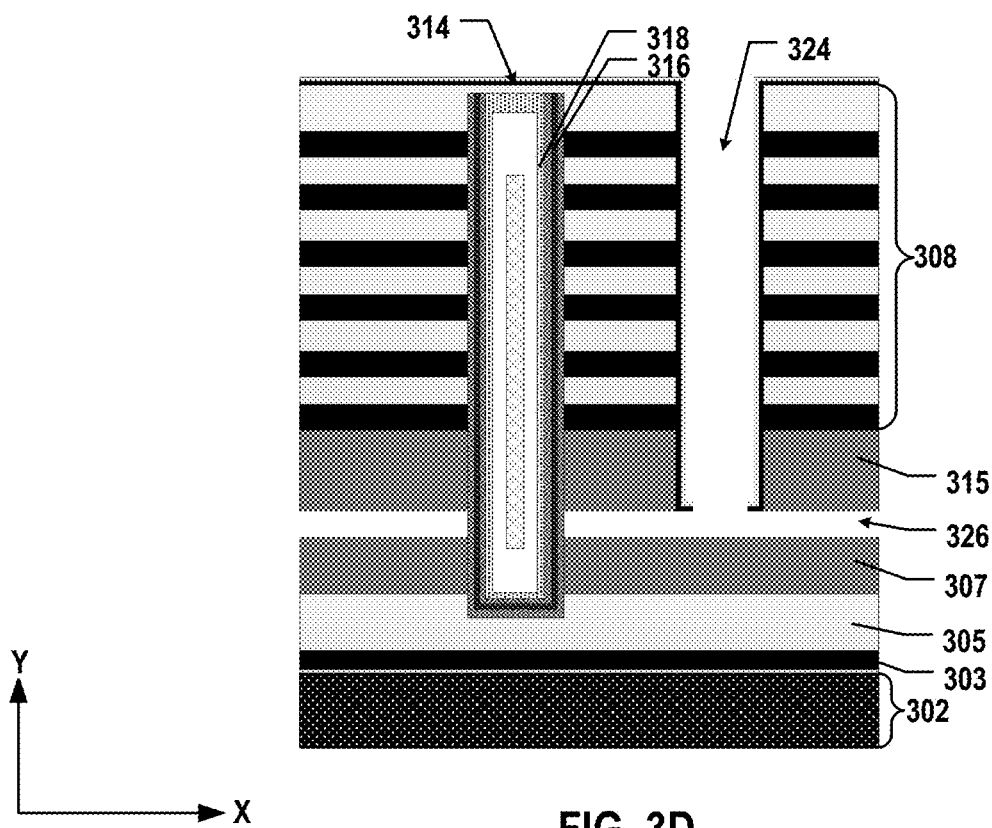

As shown in FIG. 1A, 3D memory device 100 can include a dielectric layer 102 and a stop layer 103 on dielectric layer 102. Dielectric layer 102 can include one or more interlayer dielectric (ILD) layers (also known as "intermetal dielectric (IMD) layers") in which the interconnect lines and VIA contacts can form. The ILD layers of dielectric layer 102 can include dielectric materials including, but not limited to, silicon oxide, silicon nitride, silicon oxynitride, low dielectric constant (low-k) dielectrics, or any combination thereof. In some embodiments, dielectric layer 102 includes silicon oxide. Stop layer 103 can be disposed directly on dielectric layer 102. In some embodiments, stop layer 103 includes a high dielectric constant (high-k) dielectric layer. The high-k dielectric layer can include, for example, aluminum oxide, hafnium oxide, zirconium oxide, or titanium oxide, to name a few. In one example, stop layer 103 may include aluminum oxide. As described below in detail, since the function of stop layer 103 is to stop the etching of channel holes, it is understood that stop layer 103 may include any other suitable materials that have a relatively high etching selectivity (e.g., greater than about 5) with respect to the materials in the layers thereabove. In some embodiments, besides functioning as an etch stop layer, stop layer 103 also functions as the backside substrate thinning stop layer and thus, has a material other than the material (e.g., silicon) of the memory array substrate.

3D memory device 100 can also include a polysilicon layer 104 above stop layer 103. In some embodiments, polysilicon layer 104 is disposed directly on stop layer 103. In some embodiments, a pad oxide layer (e.g., a silicon oxide layer) is disposed between stop layer 103 and polysilicon layer 104 to relax the stress between polysilicon layer 104 and stop layer 103 (e.g., an aluminum oxide layer). Polysilicon layer 104 includes an N-type doped polysilicon layer, according to some embodiments. That is, polysilicon layer 104 can be doped with any suitable N-type dopants, such as phosphorus (P), arsenic (Ar), or antimony (Sb), which contribute free electrons and increase the conductivity of the intrinsic semiconductor. As described below in detail, due to a diffusion process, polysilicon layer 104 can have a uniform doping concentration profile in the vertical direction. In some embodiments, the doping concentration of polysilicon layer 104 is between about $10^{19}$ cm$^{-3}$ and about $10^{22}$ cm$^{-3}$, such as between $10^{19}$ cm$^{-3}$ and $10^{22}$ cm$^{-3}$ (e.g., $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ $10^{21}$ cm$^{-3}$, $2\times10^{21}$ cm$^{-3}$, $3\times10^{21}$ cm$^{-3}$, $4\times10^{21}$ cm$^{-3}$, $5\times10^{21}$ cm$^{-3}$, $6\times10^{21}$ cm$^{-3}$, $7\times10^{21}$ cm$^{-3}$, $8\times10^{21}$ cm$^{-3}$, $9\times10^{21}$ cm$^{-3}$, $10^{22}$ cm$^{-3}$, any range bounded by the lower end by any of these values, or in any range defined by any two of these values). Although FIG. 1A shows that polysilicon layer 104 is above stop layer 103, as described above, it is understood that stop layer 103 may be above polysilicon layer 104 in some examples because the memory array devices shown in FIG. 1A may be flipped upside down, and their relative positions may be changed accordingly in 3D memory device 100. In some embodiments, the memory array devices shown in FIG. 1A are flipped upside down (in the top) and bonded to peripheral devices (in the bottom) in 3D memory device 100, such that stop layer 103 is above polysilicon layer 104.

In some embodiments, 3D memory device 100 further includes a source contact structure 128 extending vertically through dielectric layer 102 and stop layer 103 from the opposite side of polysilicon layer 104 with respect to stop layer 103 (i.e., the backside) to be in contact with polysilicon layer 104. It is understood that the depth that source contact structure 128 extends into polysilicon layer 104 may vary in different examples. Source contact structure can electrically connect the source of the NAND memory strings of 3D memory device 100 to the peripheral devices through polysilicon layer 104 from the backside of the memory array substrate (removed) and thus, can be referred to herein as a "backside source pick up" as well. Source contact structure 128 can include any suitable types of contacts. In some embodiments, source contact structure 128 includes a VIA contact. In some embodiments, source contact structure 128 includes a wall-shaped contact extending laterally. Source contact structure 128 can include one or more conductive layers, such as a metal layer, for example, tungsten (W), cobalt (Co), copper (Cu), or aluminum (Al) or a silicide layer surrounded by an adhesive layer (e.g., titanium nitride (TiN)).

In some embodiments, 3D memory device 100 is a NAND Flash memory device in which memory cells are provided in the form of an array of NAND memory strings.

Each NAND memory string can include a channel structure 112 that extends through a plurality of pairs each including a stack conductive layer 108 and a stack dielectric layer 110 (referred to herein as "conductive/dielectric layer pairs"). The stacked conductive/dielectric layer pairs are also referred to herein as a memory stack 106. The number of the conductive/dielectric layer pairs in memory stack 106 (e.g., 32, 64, 96, 128, 160, 192, 224, 256, etc.) determines the number of memory cells in 3D memory device 100. Although not shown in FIG. 1A, it is understood that in some embodiments, memory stack 106 may have a multi-deck architecture, such as a dual-deck architecture that includes a lower memory deck and an upper memory deck on the lower memory deck. The numbers of the pairs of stack conductive layers 108 and stack dielectric layers 110 in each memory deck can be the same or different.

Memory stack 106 can include a plurality of interleaved stack conductive layers 108 and stack dielectric layers 110 polysilicon layer 104. Stack conductive layers 108 and stack dielectric layers 110 in memory stack 106 can alternate in the vertical direction. In other words, except the ones at the top or bottom of memory stack 106, each stack conductive layer 108 can be adjoined by two stack dielectric layers 110 on both sides, and each stack dielectric layer 110 can be adjoined by two stack conductive layers 108 on both sides. Stack conductive layers 108 can include conductive materials including, but not limited to, W, Co, Cu, Al, polysilicon, doped silicon, silicides, or any combination thereof. Each stack conductive layer 108 can include a gate electrode (gate line) surrounded by an adhesion layer and a gate dielectric layer 124. The gate electrode of stack conductive layer 108 can extend laterally as a word line, ending at one or more staircase structures (not shown) of memory stack 106. Stack dielectric layers 110 can include dielectric materials including, but not limited to, silicon oxide, silicon nitride, silicon oxynitride, or any combination thereof.

As shown in FIG. 1A, each channel structure 112 extending vertically through memory stack 106 and polysilicon layer 104, stopping at stop layer 103. That is, channel structure 112 can include two portions: the lower portion surrounded by polysilicon layer 104 (i.e., below the interface between polysilicon layer 104 and stop layer 103) and the upper portion surrounded by memory stack 106 (i.e., above the interface between polysilicon layer 104 and memory stack 106). As used herein, the "upper portion/end" of a component (e.g., channel structure 112) is the portion/end farther away from the substrate in the y-direction, and the "lower portion/end" of the component (e.g., channel structure 112) is the portion/end closer to the substrate in the y-direction when the substrate is positioned in the lowest plane of 3D memory device 100. In some embodiments, each channel structure 112 does not extend further beyond stop layer 103 as the etching of the channel hole being stopped by stop layer 103. For example, the lower end of channel structure 112 may be nominally flush with the top surface of stop layer 103. As a result, the gouging variations among the array of channel structures 112 can be controlled and minimized by stop layer 103.

Channel structure 112 can include a channel hole filled with semiconductor material(s) (e.g., as a semiconductor channel 116) and dielectric material(s) (e.g., as a memory film 114). In some embodiments, semiconductor channel 116 includes silicon, such as amorphous silicon, polysilicon, or single crystalline silicon. In one example, semiconductor channel 116 includes polysilicon. In some embodiments, memory film 114 is a composite layer including a tunneling layer, a storage layer (also known as a "charge trap layer"), and a blocking layer. The remaining space of the channel hole can be partially or fully filled with a capping layer 118 including dielectric materials, such as silicon oxide, and/or an air gap. Channel structure 112 can have a cylinder shape (e.g., a pillar shape). Capping layer 118, semiconductor channel 116, the tunneling layer, the storage layer, and the blocking layer of memory film 114 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high-k dielectrics, or any combination thereof. In one example, memory film 114 can include a composite layer of silicon oxide/silicon oxynitride/silicon oxide (ONO). In some embodiments, channel structure 112 further includes a channel plug 120 at the top of the upper portion of channel structure 112. Channel plug 120 can include semiconductor materials (e.g., polysilicon). In some embodiments, channel plug 120 functions as the drain of the NAND memory string.

As shown in FIG. 1A, part of semiconductor channel 116 along the sidewall of channel structure 112 (e.g., in the lower portion of channel structure 112) is in contact with a sublayer 109 of polysilicon layer 104, according to some embodiments. That is, memory film 114 is disconnected in the lower portion of channel structure 112 that abuts sublayer 109 of polysilicon layer 104, exposing semiconductor channel 116 to be in contact with the surrounding sublayer 109 of polysilicon layer 104, according to some embodiments. As a result, sublayer 109 of polysilicon layer 104 surrounding and in contact with semiconductor channel 116 can work as the "sidewall SEG" of channel structure 112 to replace the "bottom SEG" as described above, which can mitigate issues such as overlay control, epitaxial layer formation, and SONO punch. As described below in detail, sublayer 109 of polysilicon layer 104 is formed separately from the rest of polysilicon layer 104, according to some embodiments. However, it is understood that as sublayer 109 of polysilicon layer 104 may have the same polysilicon material as the rest of polysilicon layer 104, and the doping concentration may be uniform in polysilicon layer 104 after diffusion, sublayer 109 may not be distinguishable from the rest of polysilicon layer 104 in 3D memory device 100. Nevertheless, sublayer 109 refers to the part of polysilicon layer 104 that is in contact with semiconductor channel 116, instead of memory film 114, in the lower portion of channel structure 112.

As shown in FIG. 1A, 3D memory device 100 can further include insulating structures 122 each extending vertically through interleaved stack conductive layers 108 and stack dielectric layers 110 of memory stack 106. Different from channel structure 112 that extends through the entire thickness of polysilicon layer 104, stopping at stop layer 103, insulating structure 122 extends into polysilicon layer 104, stopping at sublayer 019 of polysilicon layer 104, according to some embodiments. That is, insulating structure 122 does not extend through the entire thickness of polysilicon layer 104 and is not in contact with stop layer 103, according to some embodiments. In some embodiments, the lower end of insulating structure 122 is nominally flush with the top surface of sublayer 109 of polysilicon layer 104. Each insulating structure 122 can also extend laterally to separate channel structures 112 into a plurality of blocks. That is, memory stack 106 can be divided into a plurality of memory blocks by insulating structures 12, such that the array of channel structures 112 can be separated into each memory block. Different from the slit structures in some 3D NAND memory devices, which include front side source contact structures, insulating structure 122 does not include any contact therein (i.e., not functioning as the source contact) and thus, does not introduce parasitic capacitance and leakage current with conductive layers 108 (including word lines), according to some embodiments. In some embodiments, each insulating structure 122 includes an opening (e.g., a slit) filled with one or more dielectric materials, including, but not limited to, silicon oxide, silicon nitride, silicon oxynitride, or any combination thereof. In one example, each insulating structure 122 may be filled with silicon oxide as an insulator core 126 and high-k dielectrics connecting with gate dielectric layer 124.

In some embodiments, by doping polysilicon layer 104 with N-type dopants, i.e., eliminating a P-well as the source of holes, 3D memory device 100 is configured to generate gate-induced drain leakage (GIDL)-assisted body biasing when performing an erase operation, according to some embodiments. The GIDL around the source select gate of the NAND memory string can generate a hole current into the NAND memory string to raise the body potential for erase operations. Moreover, by eliminating a P-well as the source of holes, the control of the source select gate can be simplified during read operations as well since the inversion channel is no longer needed when performing read operations by 3D memory device 100.

As described above and further described below in detail, the memory array substrate on which stop layer 103, polysilicon layer 104, memory stack 106, channel structures 112, and insulating structure 122 are formed is removed from 3D memory device 100, 3D memory device 100 does not include the memory array substrate, according to some embodiments. In some embodiments in which the removed memory array substrate includes single crystalline silicon, each channel structure 112 is not in intact with a single crystalline silicon layer that is part of the memory array substrate (e.g., after thinning).

Figure 1B:
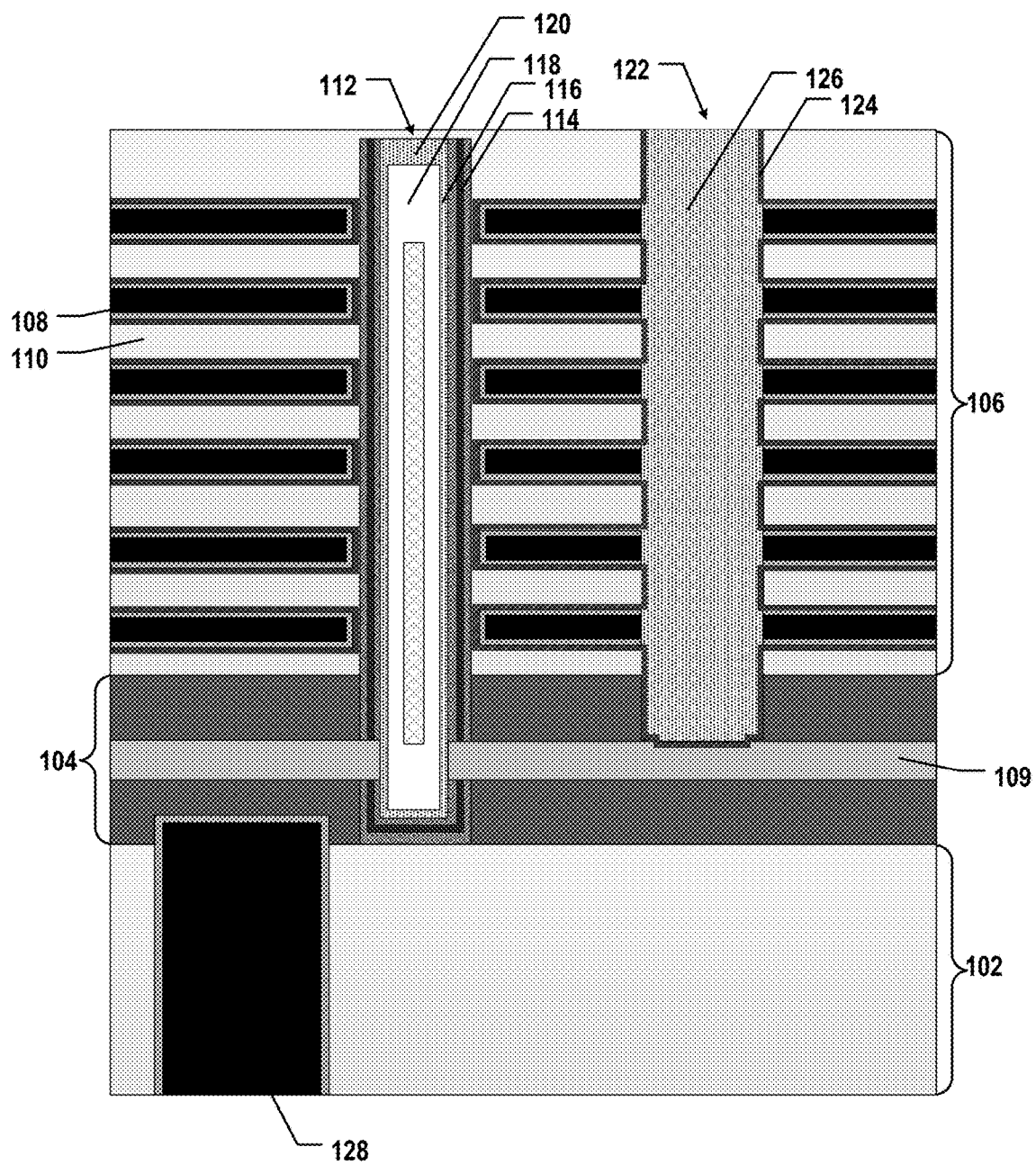

It is understood that in some embodiments, stop layer 103 may be removed from the final product of 3D memory device. For example, as shown in FIG. 1B, a 3D memory device 101 may be the same as 3D memory device 100 except that 3D memory device 101 may not include a stop layer between polysilicon layer 104 and dielectric layer 102. Instead, polysilicon layer 104 is disposed directly on dielectric layer 102, and source contact structure 128 extends vertically through dielectric layer 102 to be in contact with polysilicon layer 104. Similar to 3D memory device 100, channel structure 112 can be stopped at the interface between polysilicon layer 104 and dielectric layer 102 and does not extend beyond polysilicon layer 104 (i.e., the lower end of channel structure 112 is nominally flush with the bottom surface of polysilicon layer 104) due to the etch stop effect of stop layer 103 during the fabrication process, which is later removed from 3D memory device 101. It is understood that the details of other same structures in both 3D memory devices 101 and 100 are not repeated for ease of description.

Figure 1C:
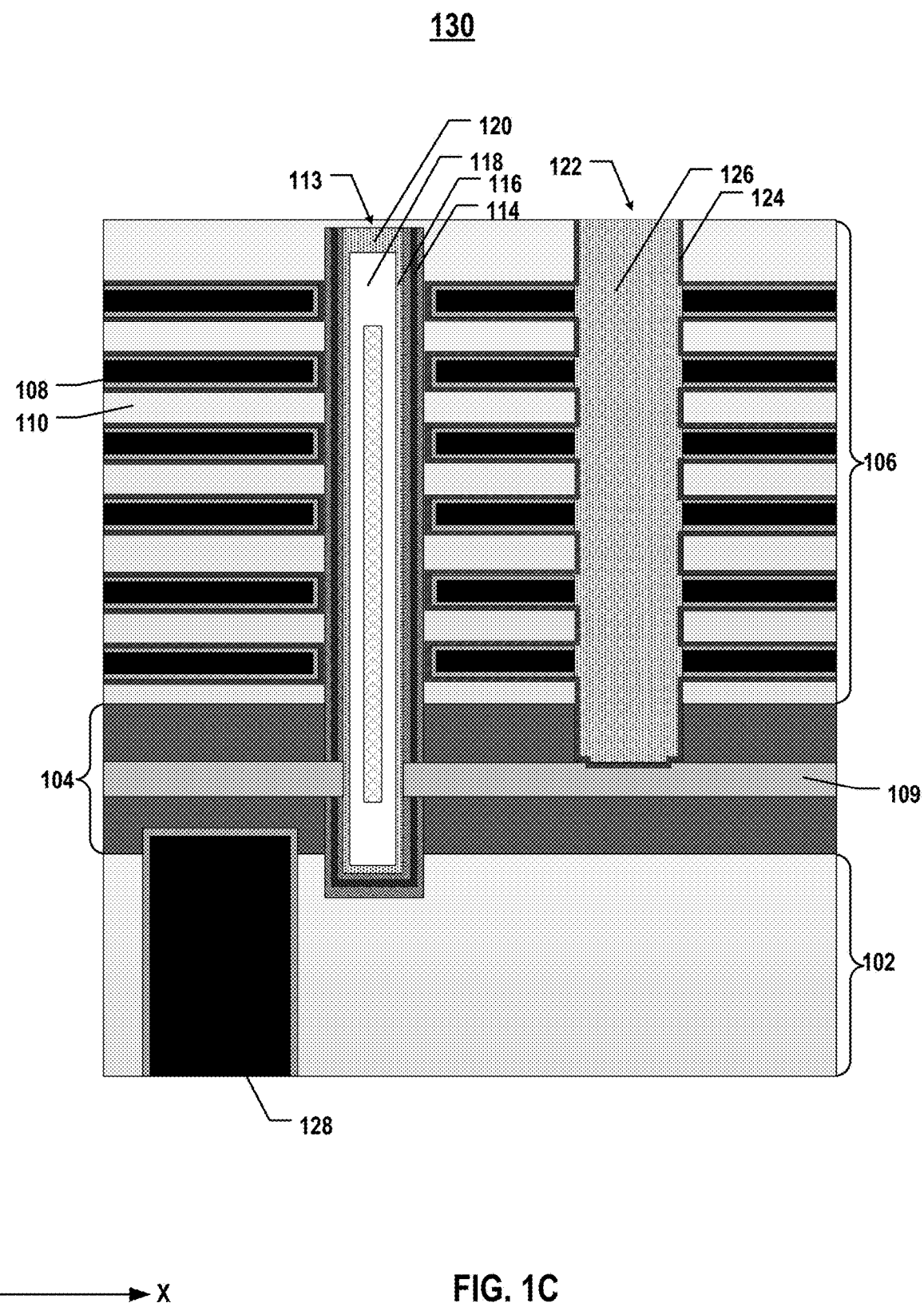

It is also understood that in some embodiments, stop layer 103 may not be formed in the first place when fabricating the 3D memory device. For example, as shown in FIG. 1C, a 3D memory device 130 may be the same as 3D memory device 101 except that one or more channel structures 113 extends beyond polysilicon layer 104 and through into dielectric layer 102 due to the missing of stop layer 103 during the fabrication process. That is, the lower end of one or more channel structure 113 is lower than the bottom surface of polysilicon layer 104, according to some embodiments. It is understood that the details of other same structures in both 3D memory devices 130 and 101 are not repeated for ease of description.

Figure 1D:
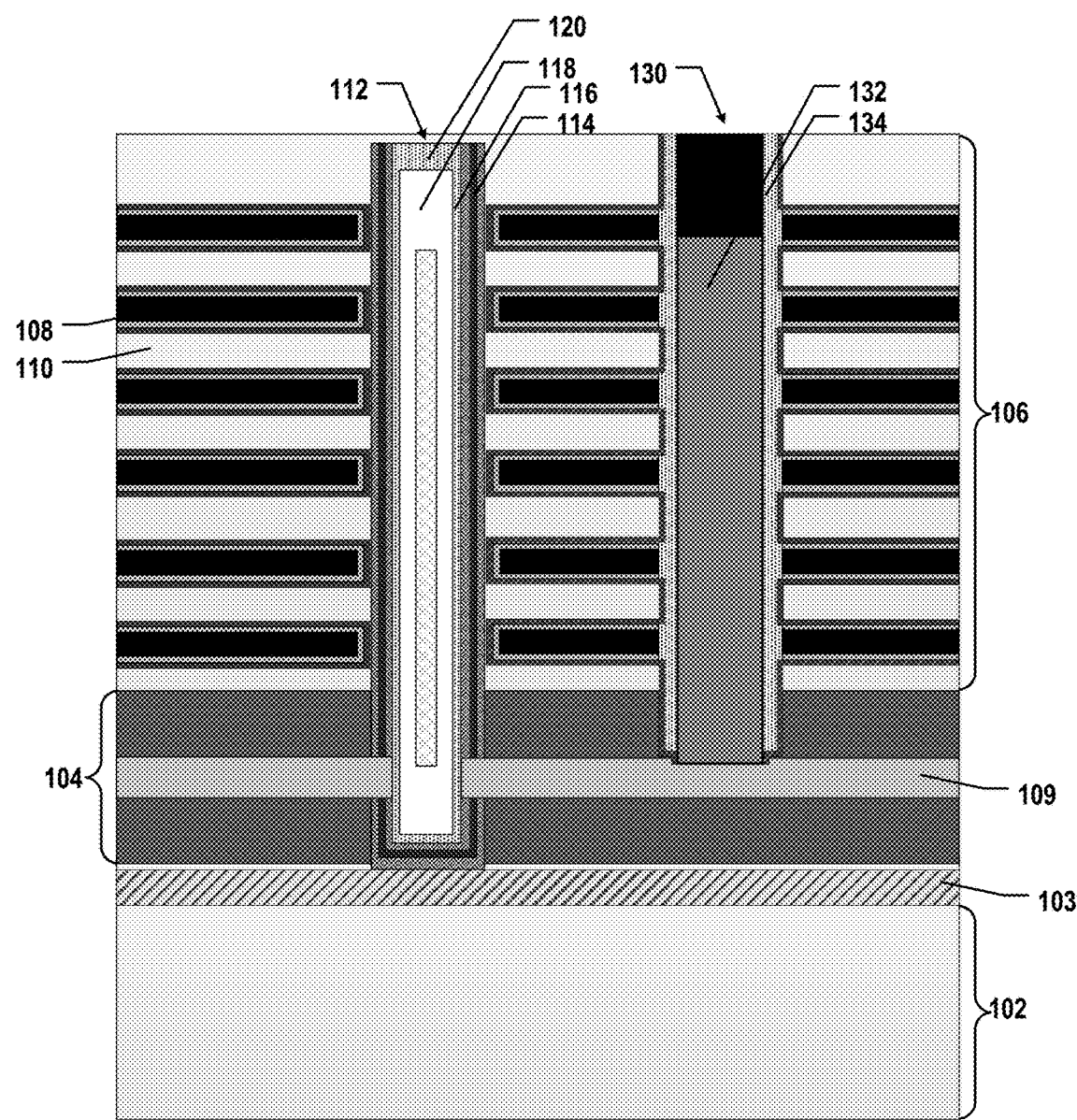

It is further understood that in some embodiments, backside source contact structures 128 in 3D memory devices 100, 101, or 103 may be replaced with front side source contact structures disposed at the same side of memory stack 106 (e.g., also known as "front side source pick up"). That is, instead of insulating structures 122 filled with dielectric materials, the slit structures can be filled with conductive materials to become source contact structures. For example, as shown in FIG. 1D, a 3D memory device 105 may be the same as 3D memory device 100 except that backside source contact structure 128 and insulating structure 122 may be replaced with a source contact structure 130 extending vertically through memory stack 106 into polysilicon layer 104. In some embodiments, source contact structure 130 stops at sublayer 109 of polysilicon layer 104. It is understood that the details of other same structures in both 3D memory devices 105 and 100 are not repeated for ease of description.

Source contact structure 130 can also extend laterally (e.g., in the direction perpendicular to x- and y-directions) to separate memory stack 106 into multiple blocks. Source contact structure 130 can include a spacer 134 and a source contact 132 each extending vertically through memory stack 106 into polysilicon layer 104. Spacer 134 can include dielectric materials, such as silicon oxide, laterally between source contact 132 and memory stack 106 to electrically separate source contact 132 from surrounding stack conductive layers 108 in memory stack 106. On the other hand, spacer 134 can be disposed along the sidewall of source contact structure 130, but not at the bottom of source contact structure 130, such that source contact 132 can be above and in contact with polysilicon layer 104 to make an electrical connection with semiconductor channel 116 of channel structure 112. In some embodiments, source contact 132 includes an adhesion layer and a conductive layer surrounded by the adhesion layer. The adhesion layer can include one or more conductive materials, such as titanium nitride (TiN), above and in contact with polysilicon layer 104 to make an electrical connection with polysilicon layer 104. In some embodiments, the conductive layer includes polysilicon in its lower portion and a metal (e.g., W) in its upper portion contacting a metal interconnect (not shown). In some embodiments, the adhesion layer (e.g., TiN) is in contact with both polysilicon layer 104 and the metal (e.g., W) of the conductive layer to form an electrical connection between polysilicon layer 104 (e.g., as the source of the NAND memory string) and the metal interconnect.

Figure 1E:
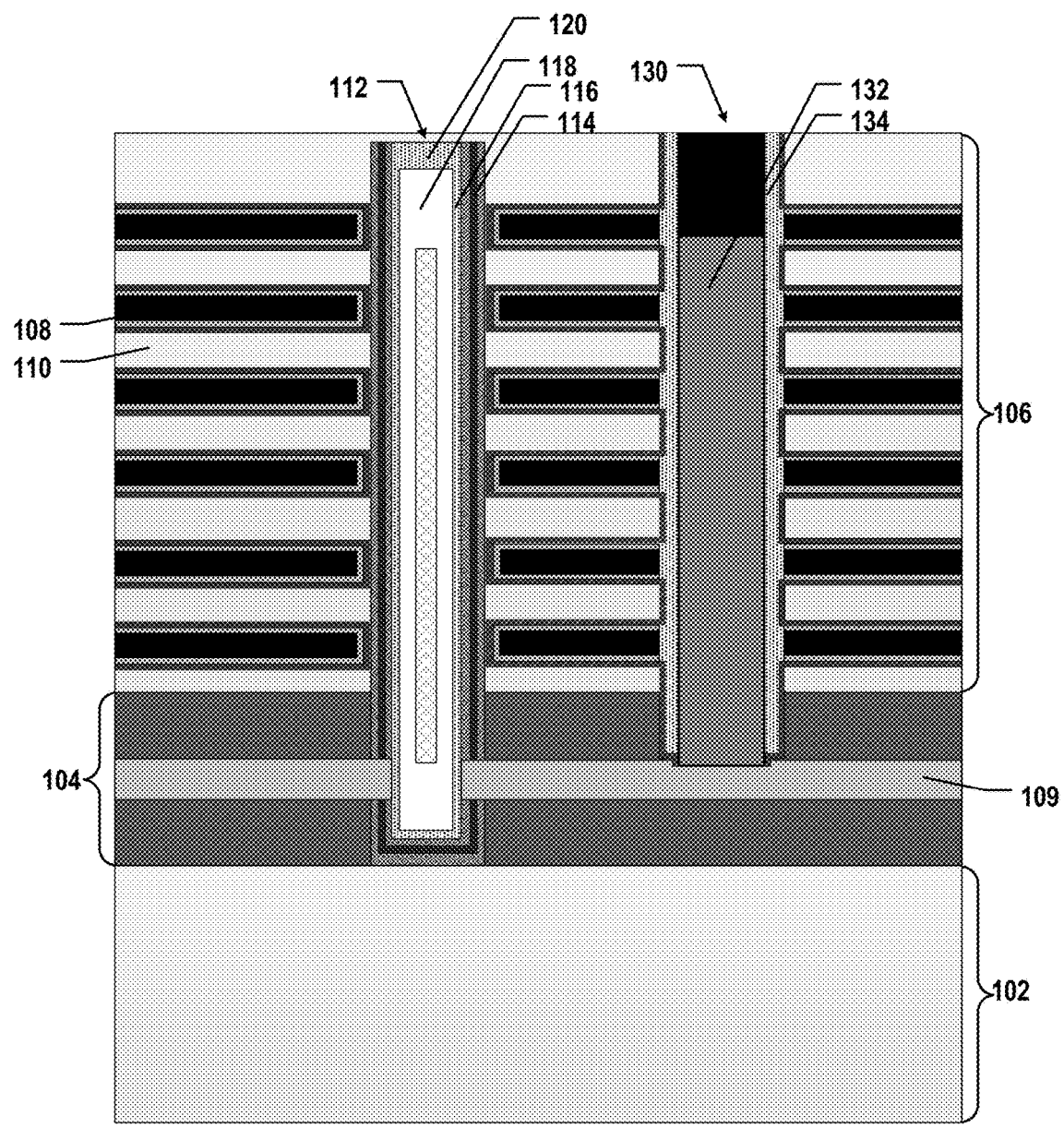

It is further understood that the design that replaces backside source contact structure 128 and insulating structure 122 with front side source contact structure 130 may be similarly applied to 3D memory devices without stop layer 103. For example, as shown in FIG. 1E, a 3D memory device 107 may be the same as 3D memory device 105 except that 3D memory device 107 does not include stop layer 103. Although FIG. 1E shows that channel structure 112 does not extend beyond polysilicon layer 104, it is understood that one or more channel structures 113 (like in 3D memory device 130 in FIG. 1C) may extend beyond polysilicon layer 104 and further into dielectric layer 102. It is understood that the details of other same structures in both 3D memory devices 107 and 105 are not repeated for ease of description.

Figure 4:
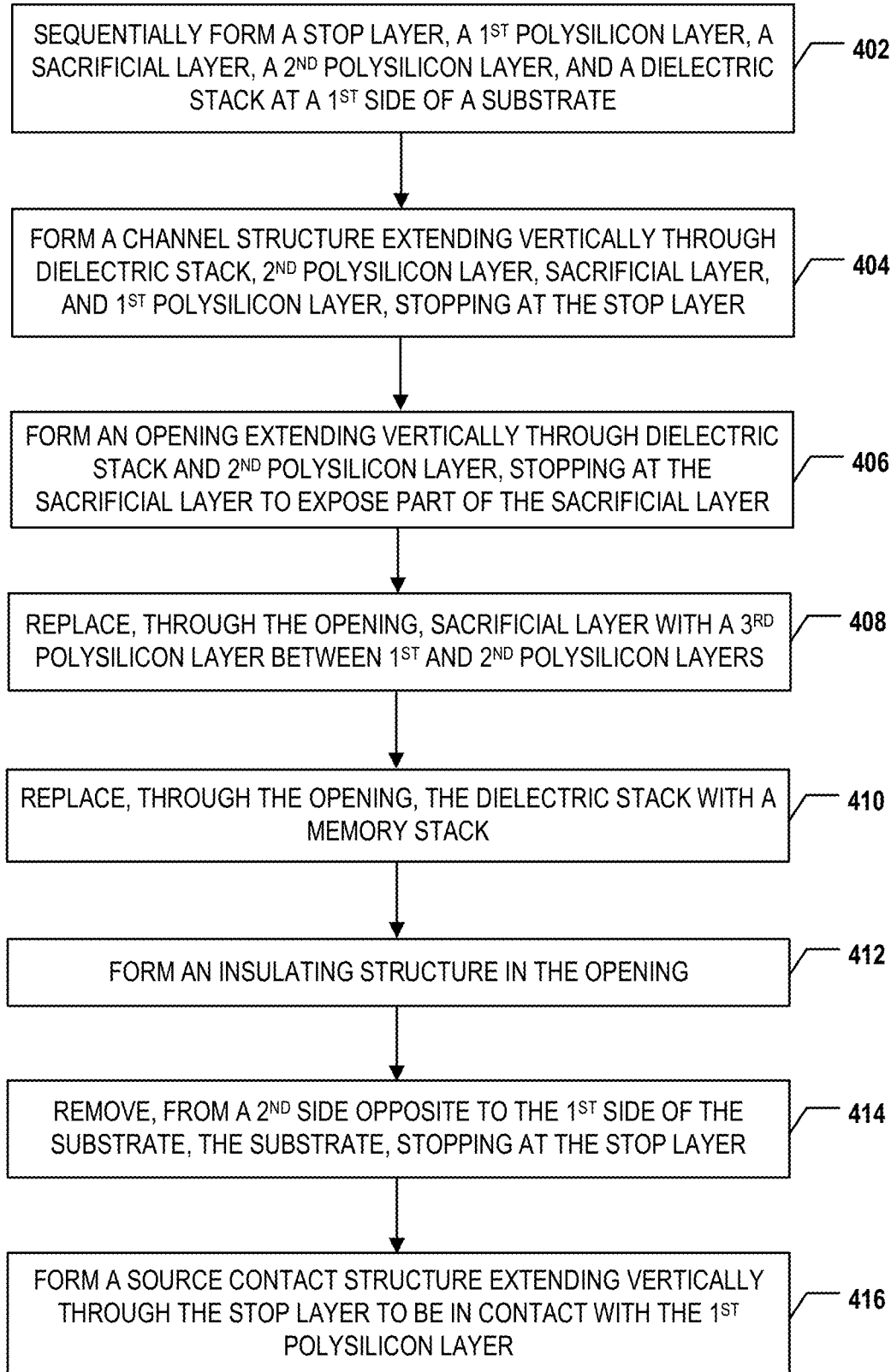
FIG. 4 illustrates a flowchart of a method for forming an exemplary 3D memory device, according to some embodiments of the present disclosure.

FIGS. 2A-2L illustrate a fabrication process for forming an exemplary 3D memory device, according to some embodiments of the present disclosure. FIG. 4 illustrates a flowchart of a method 400 for forming an exemplary 3D memory device, according to some embodiments of the present disclosure. Examples of the 3D memory device depicted in FIGS. 2A-2L and 4 include 3D memory devices 100 and 101 depicted in FIGS. 1A and 1B. FIGS. 2A-2L and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a stop layer, a first polysilicon layer, a sacrificial layer, a second polysilicon layer, and a dielectric stack are sequentially formed at a first side of a substrate. The substrate can be a silicon substrate or a carrier substrate, made of any suitable materials, such as glass, sapphire, plastic, to name a few, to reduce the cost of the substrate. The first side can be the front side of the substrate on which semiconductor devices can be formed. In some embodiments, to form the stop layer, a first stop layer and a second stop layer are sequentially formed. The first stop layer can include silicon nitride, and the second stop layer can include high-k dielectric. In some embodiments, to form the sacrificial layer, a first sacrificial layer, a second sacrificial layer, and a third sacrificial layer are sequentially formed. The first sacrificial layer can include silicon oxynitride, the second sacrificial layer can include polysilicon, and the third sacrificial layer can include silicon oxynitride. The dielectric stack can include a plurality of interleaved stack sacrificial layers and stack dielectric layers.

Figure 2A:
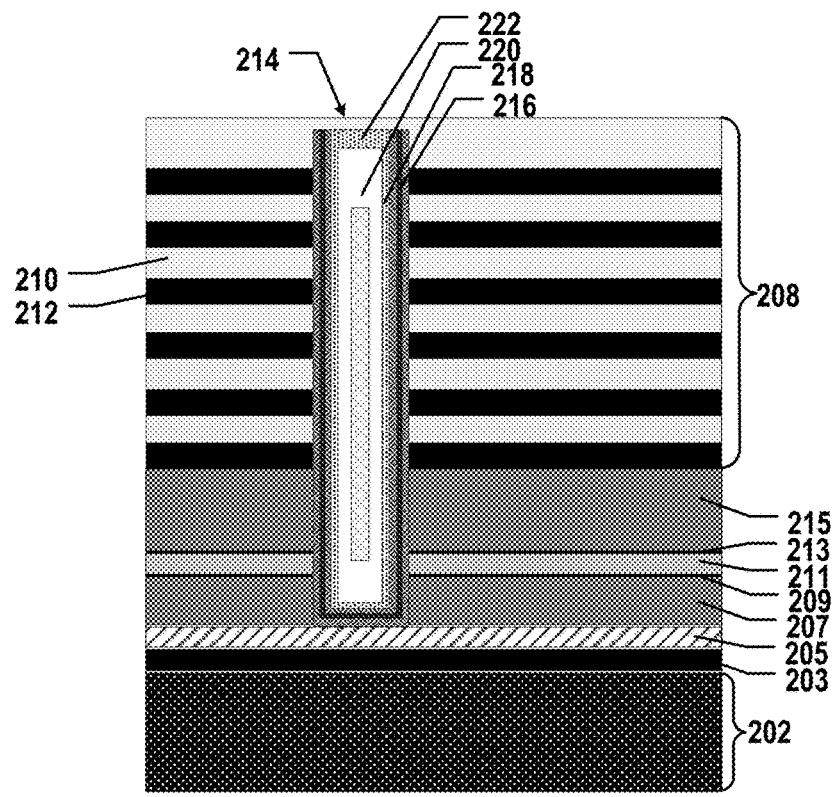
FIGS. 2A-2L illustrate a fabrication process for forming an exemplary 3D memory device, according to some embodiments of the present disclosure.

As illustrated in FIG. 2A, a first stop layer 203, a second stop layer 205, a first polysilicon layer 207, a first sacrificial layer 209, a second sacrificial layer 211, a third sacrificial layer 213, and a second polysilicon layer 215 are sequentially formed at the front side of a substrate 202. Substrate 202 can be a silicon substrate, or a carrier substrate made of any suitable materials, such as glass, sapphire, plastic, to name a few. First and second stop layers 203 and 205 may be collectively referred to herein as a stop layer. In some embodiments, first and second stop layers 203 and 205 include silicon nitride and high-k dielectric, such as aluminum oxide, respectively. As described below in detail, first stop layer 203 can act as the stop layer when removing substrate 202 from the backside and thus, may include any other suitable materials other than the material of substrate 202. Similarly, second stop layer 205 can act as the stop layer when etching the channel holes from the front side and thus, may include any other suitable materials that have a high etching selectivity (e.g., greater than about 5) with respect to polysilicon (the material of first polysilicon layer 207 on second stop layer 205). It is understood that in some examples, one of first and second stop layers 203 and 205 may be skipped, meaning that the other one of first and second stop layers 203 and 205 may act as the stop layer for both backside thinning and front side etching. For example, the stop layer may include only a high-k dielectric layer, e.g., an aluminum oxide layer. It is also understood in some embodiments, pad oxide layers (e.g., silicon oxide layers) may be formed between substrate 202 and first stop layer 203 and/or between first stop layer 203 and second stop layer 205 to relax the stress between different layers. Similarly, another pad oxide layer may be formed between second stop layer 205 and first polysilicon layer 207 to relax the stress therebetween.

First, second, and third sacrificial layers 209, 211, and 213 may be collectively referred to herein as a sacrificial layer. In some embodiments, first, second, and third sacrificial layers 209, 211, and 213 include silicon oxynitride, polysilicon, and silicon oxynitride, respectively. As described below in detail, third sacrificial layer 213 can act as the stop layer when etching the slit openings from the front side and can be later selectively removed and thus, may include any other suitable materials that have a high etching selectivity (e.g., greater than about 5) with respect to polysilicon (the material of second polysilicon layer 215 on third sacrificial layer 213). Second sacrificial layer 211 can be later selectively removed and thus, may include any other suitable materials that have a high etching selectivity (e.g., greater than about 5) with respect to dielectrics, such as polysilicon or carbon. First sacrificial layer 209 can act as the stop layer when etching second sacrificial layer 211 and can be later selectively removed and thus, may include any other suit- able materials that have a high etching selectivity (e.g., greater than about 5) with respect to polysilicon (the material of second sacrificial layer 211 and first polysilicon layer 207).

First stop layer 203, second stop layer 205, first polysilicon layer 207, first sacrificial layer 209, second sacrificial layer 211, third sacrificial layer 213, and second polysilicon layer 215 (or any other layers therebetween) can be formed by sequentially depositing corresponding materials in this order in multiple cycles using one or more thin film deposition processes including, but not limited to, chemical vapor deposition (CVD), physical vapor deposition (PVD), atomic layer deposition (ALD), electroplating, electroless deposition, any other suitable deposition processes, or any combination thereof. In some embodiments, at least one of first and second polysilicon layers 207 and 215 is doped with N-type dopants, such as P, As, or Sb. In one example, the at least one of first and second polysilicon layers 207 and 215 may be doped using an ion implantation process after depositing polysilicon materials. In another example, in-situ doping of N-type dopants may be performed when depositing polysilicon to form the at least one of first and second polysilicon layers 207 and 215. It is understood that in some examples, none of first and second polysilicon layers 207 and 215 is doped with N-type dopants at this stage.

As illustrated in FIG. 2A, a dielectric stack 208 including a plurality pairs of a first dielectric layer (known as a "stack sacrificial layer 212") and a second dielectric layer (known as a "stack dielectric layer 210") is formed on second polysilicon layer 215. Dielectric stack 208 includes interleaved stack sacrificial layers 212 and stack dielectric layers 210, according to some embodiments. Stack dielectric layers 210 and stack sacrificial layers 212 can be alternatively deposited on second polysilicon layer 215 to form dielectric stack 208. In some embodiments, each stack dielectric layer 210 includes a layer of silicon oxide, and each stack sacrificial layer 212 includes a layer of silicon nitride. Dielectric stack 208 can be formed by one or more thin film deposition processes including, but not limited to, CVD, PVD, ALD, or any combination thereof. In some embodiments, a pad oxide layer (e.g., silicon oxide layer, not shown) is formed between second polysilicon layer 215 and dielectric stack 208.

Method 400 proceeds to operation 404, as illustrated in FIG. 4, in which a channel structure extending vertically through the dielectric stack, the second polysilicon layer, the sacrificial layer, and the first polysilicon layer, stopping at the stop layer is formed. In some embodiments, to form the channel structure, a channel hole extending vertically through the dielectric stack, the second polysilicon layer, the sacrificial layer, and the first polysilicon layer is formed, and a memory film and a semiconductor channel are sequentially formed along a sidewall of the channel hole. In some embodiments, a channel plug is formed above and in contact with the semiconductor channel.

As illustrated in FIG. 2A, a channel hole is an opening extending vertically through dielectric stack 208, second polysilicon layer 215, sacrificial layers 213, 211, and 209, and first polysilicon layer 207, stopping at second stop layer 205. In some embodiments, a plurality of openings are formed, such that each opening becomes the location for growing an individual channel structure 214 in the later process. In some embodiments, fabrication processes for forming the channel hole of channel structure 214 include wet etching and/or dry etching processes, such as deep-ion reactive etching (DRIE). The etching of the channel hole continues until being stopped by second stop layer 205, such as a high-k dielectric layer (e.g., an aluminum oxide layer), due to the etching selectivity between the materials of second stop layer 205 (e.g., aluminum oxide) and first polysilicon layer 207 (i.e., polysilicon), according to some embodiments. In some embodiments, the etching conditions, such as etching rate and time, can be controlled to ensure that each channel hole has reached and stopped by second stop layer 205 to minimize the gouging variations among the channel holes and channel structures 214 formed therein. It is understood that depending on the specific etching selectivity, one or more channel holes may extend into second stop layer 205 to a small extent, which is still viewed as being stopped by second stop layer 205 and having its lower end nominally flush with the top surface of second stop layer 205 in the present disclosure.

As illustrated in FIG. 2A, a memory film 216 (including a blocking layer, a storage layer, and a tunneling layer) and a semiconductor channel 218 are sequentially formed in this order along sidewalls and the bottom surface of the channel hole. In some embodiments, memory film 216 is first deposited along the sidewalls and bottom surface of the channel hole, and semiconductor channel 218 is then deposited over memory film 216. The blocking layer, storage layer, and tunneling layer can be subsequently deposited in this order using one or more thin film deposition processes, such as ALD, CVD, PVD, any other suitable processes, or any combination thereof, to form memory film 216. Semiconductor channel 218 can then be formed by depositing a semiconductor material, such as polysilicon, over the tunneling layer of memory film 216 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 216 and semiconductor channel 218.

As illustrated in FIG. 2A, a capping layer 220 is formed in the channel hole and over semiconductor channel 218 to completely or partially fill the channel hole (e.g., without or with an air gap). Capping layer 220 can be formed by depositing a dielectric material, such as silicon oxide, using one or more thin film deposition processes, such as ALD, CVD, PVD, any other suitable processes, or any combination thereof. A channel plug 222 then can be formed in the upper portion of the channel hole. In some embodiments, parts of memory film 216, semiconductor channel 218, and capping layer 220 that are on the top surface of dielectric stack 208 are removed and planarized by CMP, wet etch, and/or dry etch processes. A recess then can be formed in the upper portion of the channel hole by wet etching and/or drying etching parts of semiconductor channel 218 and capping layer 220 in the upper portion of the channel hole. Channel plug 222 then can be formed by depositing semiconductor materials, such as polysilicon, into the recess by one or more thin film deposition processes, such as CVD, PVD, ALD, or any combination thereof. Channel structure 214 is thereby formed through dielectric stack 208, second polysilicon layer 215, sacrificial layers 213, 211, and 209, and first polysilicon layer 207, stopping at second stop layer 205, according to some embodiments.

Method 400 proceeds to operation 406, as illustrated in FIG. 4, in which an opening extending vertically through the dielectric stack and the second polysilicon layer, stopping at the sacrificial layer is formed to expose part of the sacrificial layer. In some embodiments, forming the opening is stopped at the third sacrificial layer.

Figure 2B:
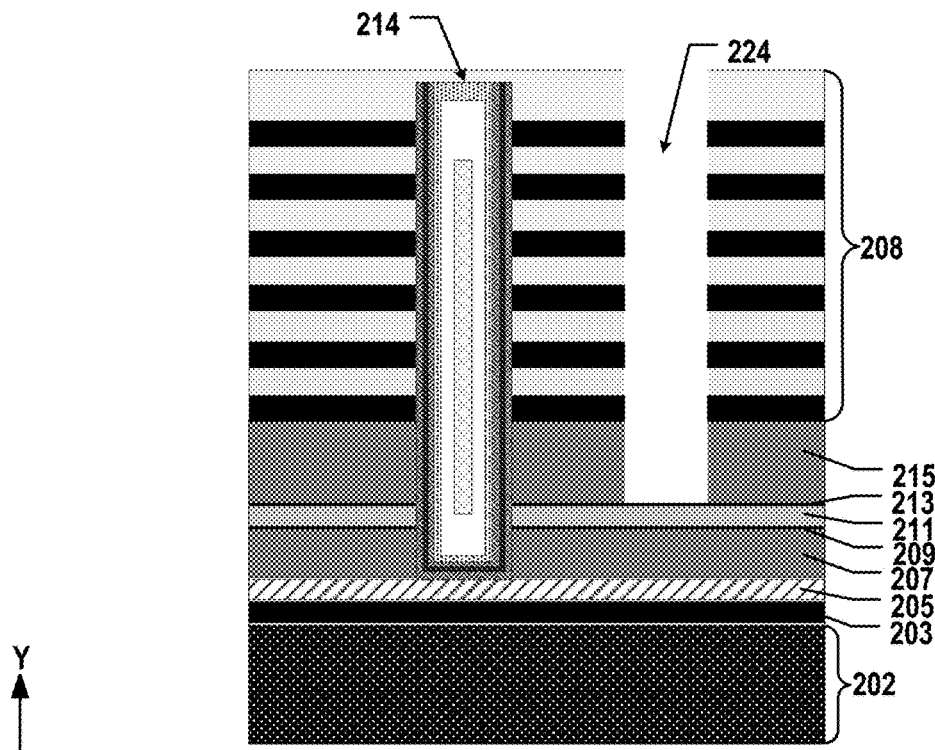

As illustrated in FIG. 2B, a slit 224 is an opening formed that extends vertically through dielectric stack 208 and second polysilicon layer 215, stopping at third sacrificial layer 213, which exposes part of third sacrificial layer 213. In some embodiments, fabrication processes for forming slit 224 include wet etch and/or dry etch processes, such as DRIE. In some embodiments, stack dielectric layers 210 and stack sacrificial layers 212 of dielectric stack 208 are first etched. The etching of dielectric stack 208 may not stop at the top surface of second polysilicon layer 215 and extend further into second polysilicon layer 215 with various depths, i.e., gouging variation. Thus, a second etching process (sometimes known as post etching treatment) can be performed to etch second polysilicon layer 215 until being stopped by third sacrificial layer 213 (e.g., a silicon oxynitride layer) due to the etching selectivity between the materials of third sacrificial layer 213 (e.g., a silicon oxynitride layer) and second polysilicon layer 215 (e.g., polysilicon).

Method 400 proceeds to operation 408, as illustrated in FIG. 4, in which the sacrificial layer is replaced, through the opening, with a third polysilicon layer between the first and second polysilicon layers. In some embodiments, to replace the sacrificial layer with the third polysilicon layer, the sacrificial layer is removed, through the opening, to form a cavity between the first and second polysilicon layers, part of the memory film is removed, through the opening, to expose part of the semiconductor channel along the sidewall of the channel hole, and polysilicon is deposited, through the opening, into the cavity to form the third polysilicon layer. In some embodiments, at least one of the first, second, and third polysilicon layers is doped with an N-type dopant. The N-type dopant can be diffused in the first, second, and third polysilicon layers.

Figure 2C:
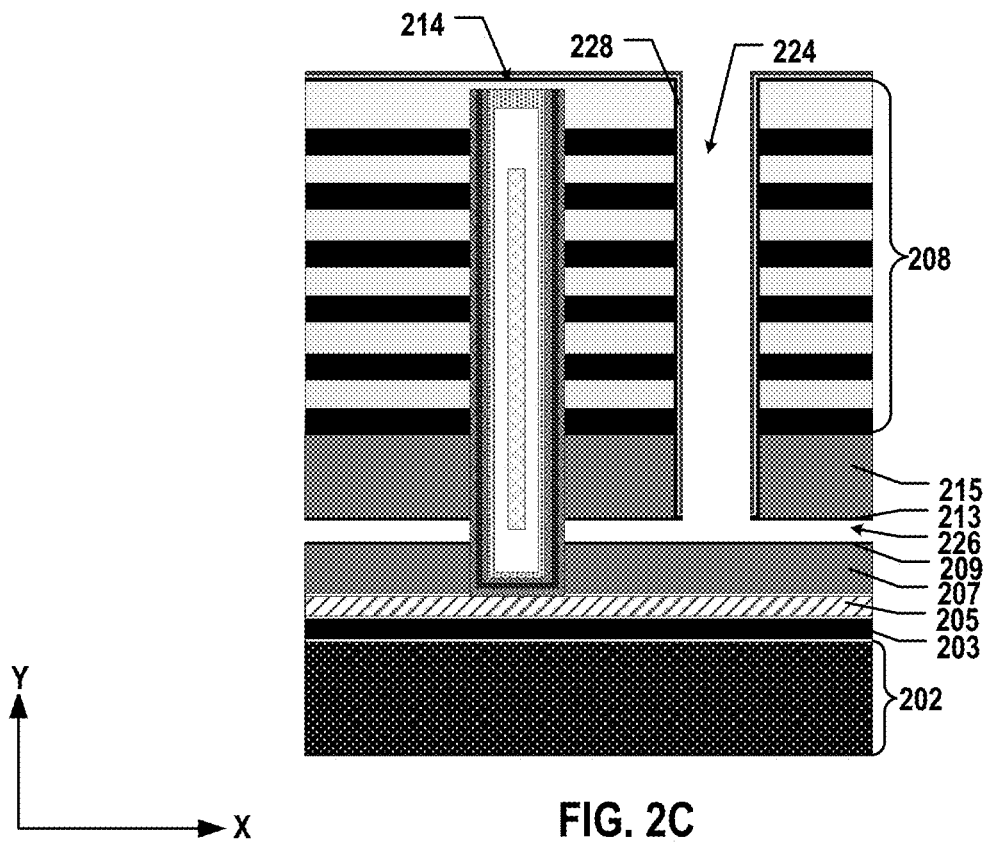

As illustrated in FIG. 2C, a spacer 228 is formed along the sidewall of slit 224 by depositing one or more dielectrics, such as high-k dielectrics, along the sidewall of slit 224. The bottom surface of spacer 228 (and part of third sacrificial layer 213 in slit 224 if still remains) can be opened using wet etch and/or dry etch processes to expose part of second sacrificial layer 211 (shown in FIG. 2B, e.g., a polysilicon layer). In some embodiments, sacrificial layer 211 is then removed by wet etching and/or dry etching to form a cavity 226. In some embodiments, second sacrificial layer 211 includes polysilicon, spacer 228 includes a high-k dielectric, first and third sacrificial layers 209 and 203 each includes silicon oxynitride, and second sacrificial layer 211 is etched by applying tetramethylammonium hydroxide (TMAH) etchant through slit 224, which can be stopped by the high-k dielectric of spacer 228 as well as the silicon oxynitride of first and third sacrificial layers 209 and 213. That is, the removal of second sacrificial layer 211 does not affect dielectric stack 208 and first and third polysilicon layers 207 and 215 protected by spacer 228 and first and third sacrificial layers 209 and 213, respectively, according to some embodiments.

Figure 2D:
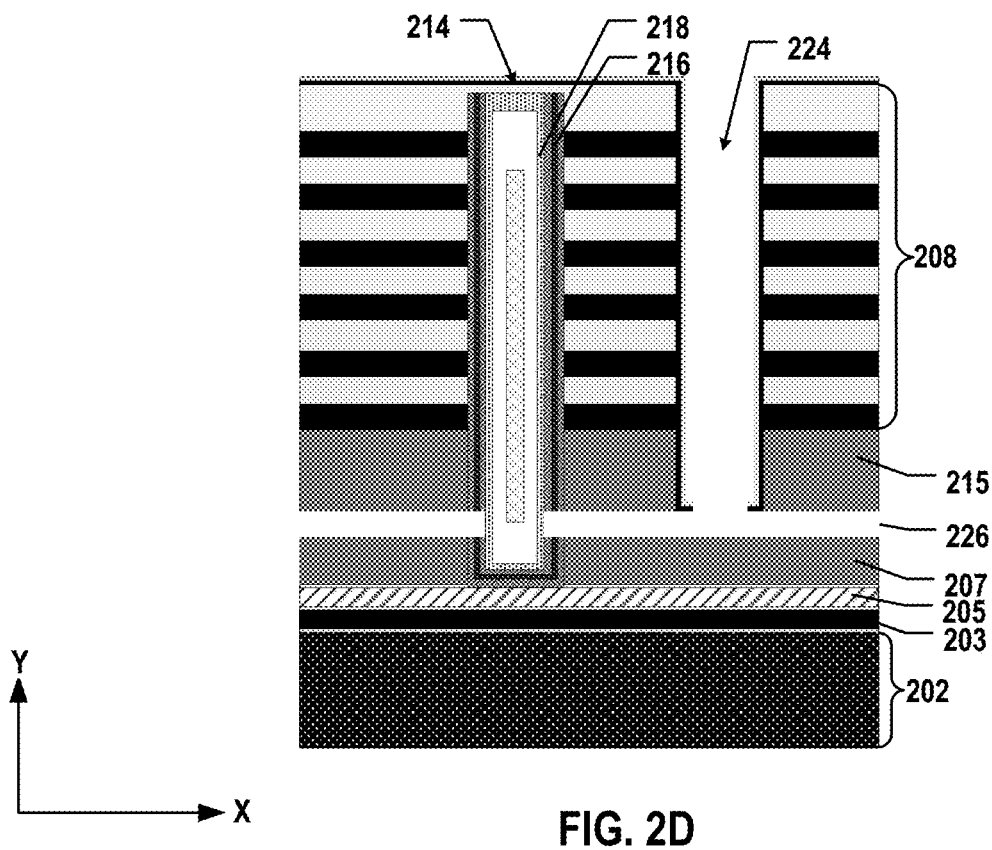

As illustrated in FIG. 2D, part of memory film 216 exposed in cavity 226 is removed to expose part of semiconductor channel 218 along the sidewall of channel structure 214. In some embodiments, parts of the blocking layer (e.g., including silicon oxide), storage layer (e.g., including silicon nitride), and tunneling layer (e.g., including silicon oxide) are etched by applying etchants through slit 224 and cavity 226, for example, phosphoric acid for etching silicon nitride and hydrofluoric acid for etching silicon oxide. The etching can be stopped by spacer 228 and semiconductor channel 218. That is, the removal of part of memory film 216 exposed in cavity 226 does not affect dielectric stack 208 (protected by spacer 228) and semiconductor channel 218 including polysilicon and capping layer 220 enclosed by semiconductor channel 218, according to some embodiments. In some embodiments, first and third sacrificial layers 209 and 213 (including silicon oxynitride) are removed as well by the same etching process.

Figure 2E:
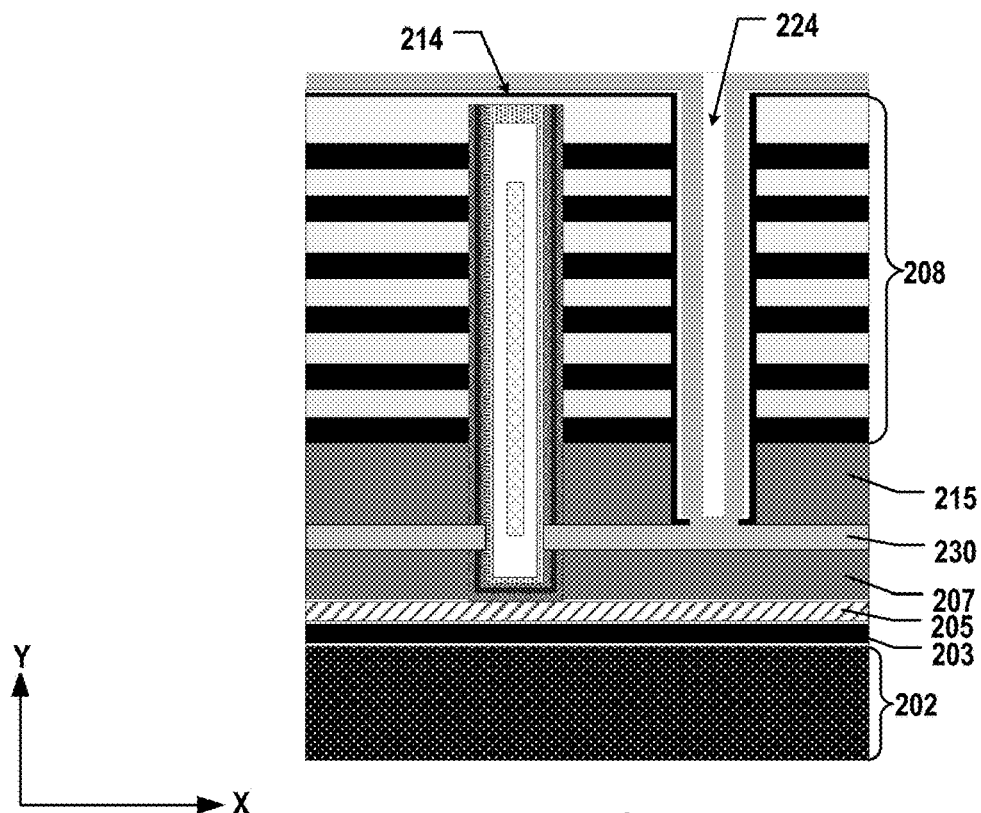

As illustrated in FIG. 2E, a third polysilicon layer 230 is formed between first and second polysilicon layers 207 and 215. In some embodiments, third polysilicon layer 230 is formed by depositing polysilicon into cavity 226 (shown in FIG. 2D) through slit 224 using one or more thin film deposition processes, such as CVD, PVD, ALD, or any combination thereof. In some embodiments, in-situ doping of N-type dopants, such as P, As, or Sb, is performed when depositing polysilicon to form third polysilicon layer 230. Third polysilicon layer 230 can fill cavity 226 to be in contact with the exposed part of semiconductor channel 218 of channel structure 214. It is understood that third polysilicon layer 230 may be doped or un-doped depending on whether at least one of first and second polysilicon layers 207 and 215 are doped with N-type dopants since at least one of first, second, and third polysilicon layers 207, 215, and 230 may need to be doped with N-type dopants. In some embodiments, the N-type dopants in at least one of first, second, and third polysilicon layers 207, 215, and 230 is diffused in first, second, and third polysilicon layers 207, 215, and 230 to achieve a uniform doping concentration profile in the vertical direction among first, second, and third polysilicon layers 207, 215, and 230 using thermal diffusion process, such as annealing. For example, the doping concentration may be between $10^{19}$ cm$^{-3}$ and $10^{22}$ cm$^{-3}$ after diffusion. As described above, the interfaces between first, second, and third polysilicon layers 207, 215, and 230 may become indistinguishable as each of first, second, and third polysilicon layers 207, 215, and 230 includes the same polysilicon material with nominally the same doping concentration. Thus, first, second, and third polysilicon layers 207, 215, and 230 may be collectively viewed as a polysilicon layer after diffusion.

Figure 2F:
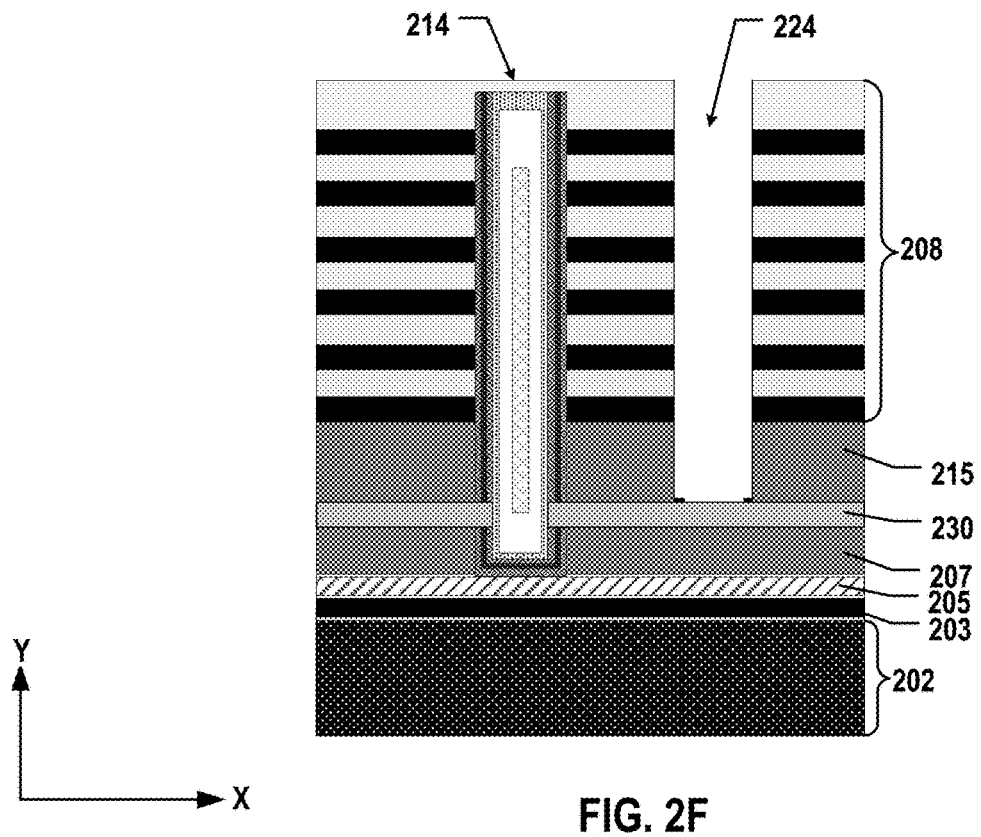

Method 400 proceeds to operation 410, as illustrated in FIG. 4, in which the dielectric stack is replaced, through the opening, with a memory stack using the so-called "gate replacement process." As illustrated in FIG. 2F, part of third polysilicon layer 230 and any remaining spacer 228 formed along the sidewall of slit 224 (shown in FIG. 2E) are removed using wet etching and/or dry etching to expose stack sacrificial layers 212 of dielectric stack 208 through slit 224. The etching process can be controlled (e.g., by controlling the etching rate and/or time), such that third polysilicon layer 230 still remains between first and second polysilicon layers 207 and 215 and in contact with semiconductor channel 218 of channel structure 214.

Figure 2G:
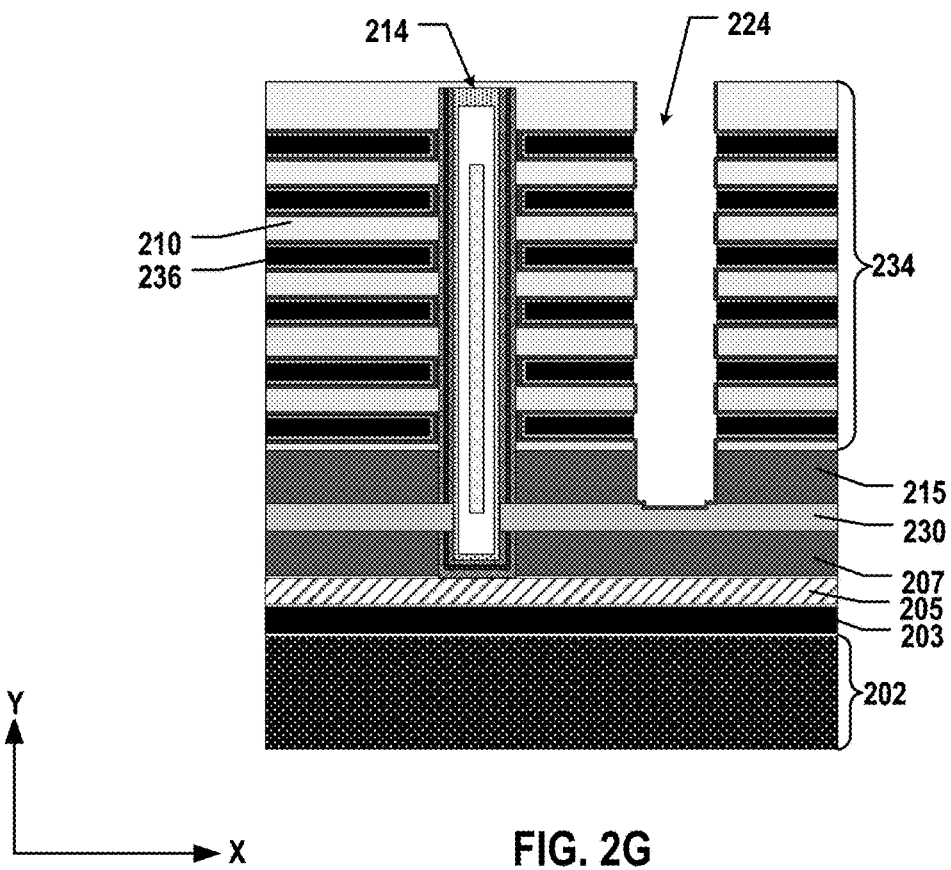

As illustrated in FIG. 2G, a memory stack 234 can be formed by a gate replacement process, i.e., replacing stack sacrificial layers 212 with stack conductive layers 236. Memory stack 234 thus can include interleaved stack conductive layers 236 and stack dielectric layers 210 on second polysilicon layer 215. In some embodiments, to form memory stack 234, stack sacrificial layers 212 are removed by applying etchants through slit 224 to form a plurality of lateral recesses. Stack conductive layers 236 then can be deposited into the lateral recesses by depositing one or more conductive materials using one or more thin film deposition processes, such as PVD, CVD, ALD, or any combinations thereof. Channel structure 214 thereby extends vertically through memory stack 234 and the polysilicon layer including first, third, and second polysilicon layers 215, 230, and 207, stopping at second stop layer 205, according to some embodiments.

Figure 2H:
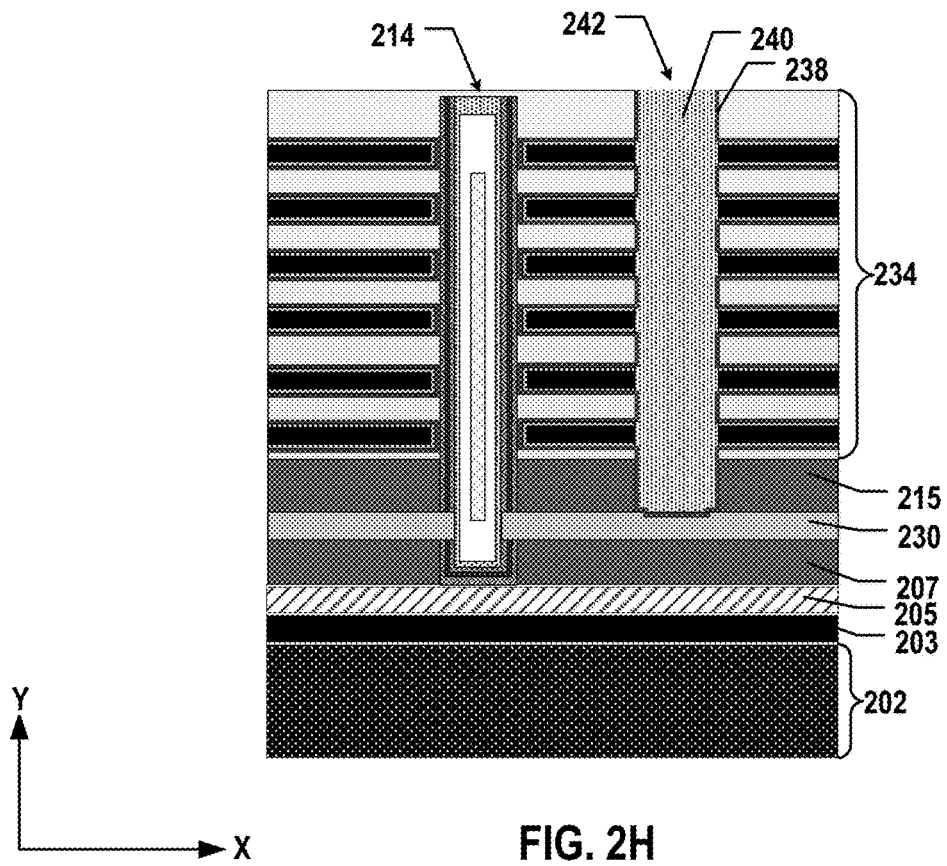

Method 400 proceeds to operation 412, as illustrated in FIG. 4, in which an insulating structure is formed in the opening. In some embodiments, to form the insulating structure, one or more dielectric materials are deposited into the opening to fill the opening. As illustrated in FIG. 2H, an insulating structure 242 is formed in slit 224 (shown in FIG. 2G). Insulating structure 242 can be formed by depositing one or more dielectric materials, such as high-k dielectrics (also as a gate dielectric layer 238) and silicon oxide as an insulating core 240, in slit 224 to completely or partially fill slit 224 with or without air gap using one or more thin film deposition processes, such as PVD, CVD, ALD, or any combinations thereof.

Figure 2I:
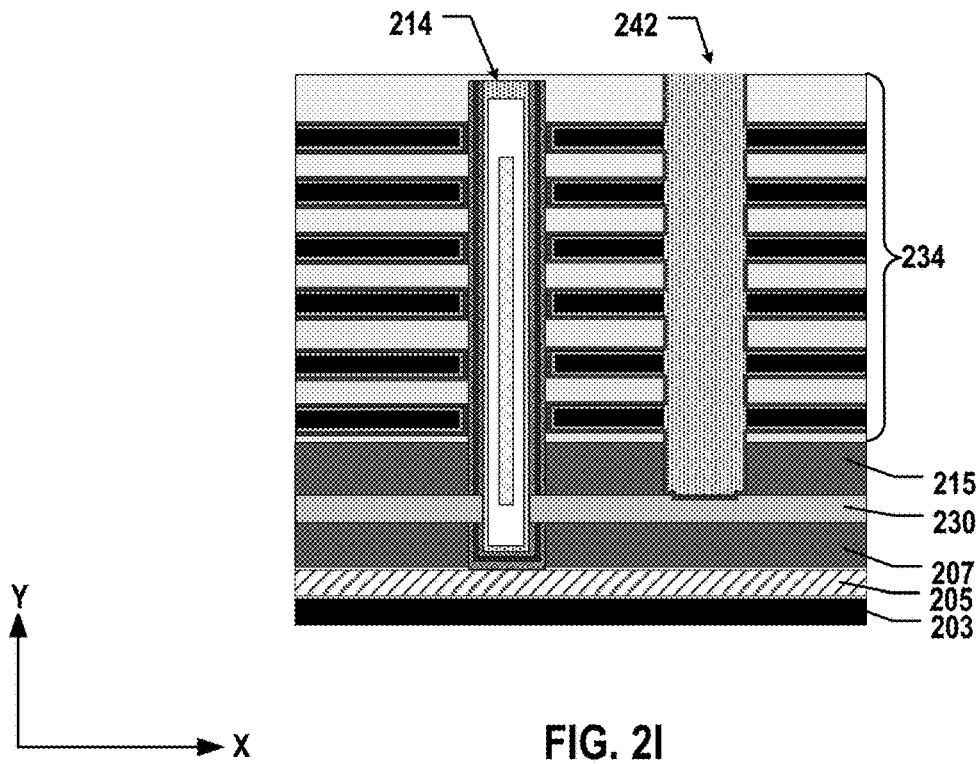

Method 400 proceeds to operation 414, as illustrated in FIG. 4, in which the substrate is removed, from a second side opposite to the first side of the substrate, stopping at the stop layer. The second side can be the backside of the substrate. As illustrated in FIG. 2I, substrate 202 (shown in FIG. 2H) is removed from the backside. Although not shown in FIG. 2I, it is understood that the intermediate structure in FIG. 2H may be flipped upside down to have substrate 202 on the top of the intermediate structure. In some embodiments, substrate 202 is completely removed using CMP, grinding, wet etching, and/or dry etching until being stopped by first stop layer 203 (e.g., a silicon nitride layer). In some embodiments, substrate 202 (a silicon substrate) is removed using silicon CMP, which is automatically stopped when reaching first stop layer 203 having materials other than silicon, i.e., acting as a backside CMP stop layer. In some embodiments, substrate 202 (a silicon substrate) is removed using wet etching by TMAH, which is automatically stopped when reaching first stop layer 203 having materials other than silicon, i.e., acting as a backside etch stop layer. As described above, in some embodiments, the stop layer may include a single layer, e.g., first or second stop layer 203 or 205, which can act both as the front side etch stop layer, and the backside CMP/etch stop layer. Nevertheless, the stop layer including first stop layer 203 and/or second stop layer 205 can ensure the complete removal of substrate 202 without the concern of thickness uniformity after thinning.

Figure 2J:
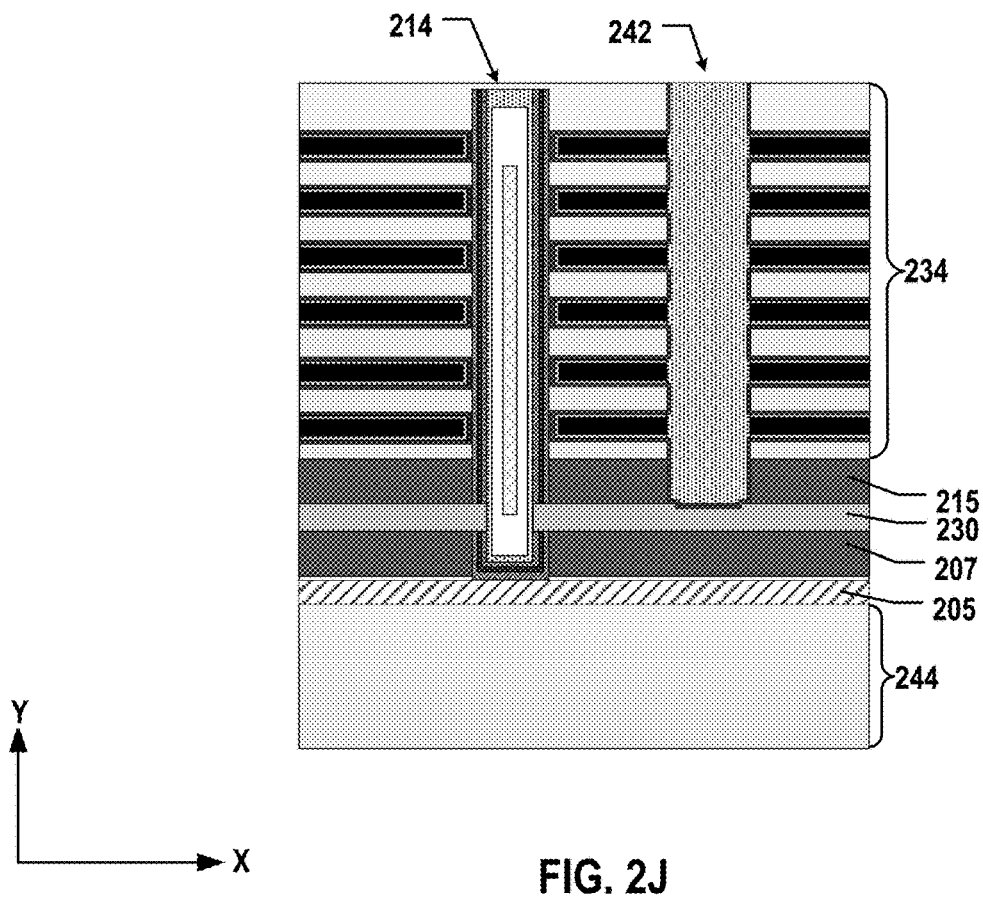

Method 400 proceeds to operation 416, as illustrated in FIG. 4, in which a source contact structure extending vertically through the stop layer is formed to be in contact with the first polysilicon layer. As illustrated in FIG. 2J, first stop layer 203 is removed using wet etching and/or dry etching to expose second stop layer 205. A dielectric layer 244 can be formed on second stop layer 205 by depositing dielectric materials, such as silicon oxide, on top of second stop layer 205 using one or more thin film deposition processes, such as PVD, CVD, ALD, or any combinations thereof.

Figure 2K:
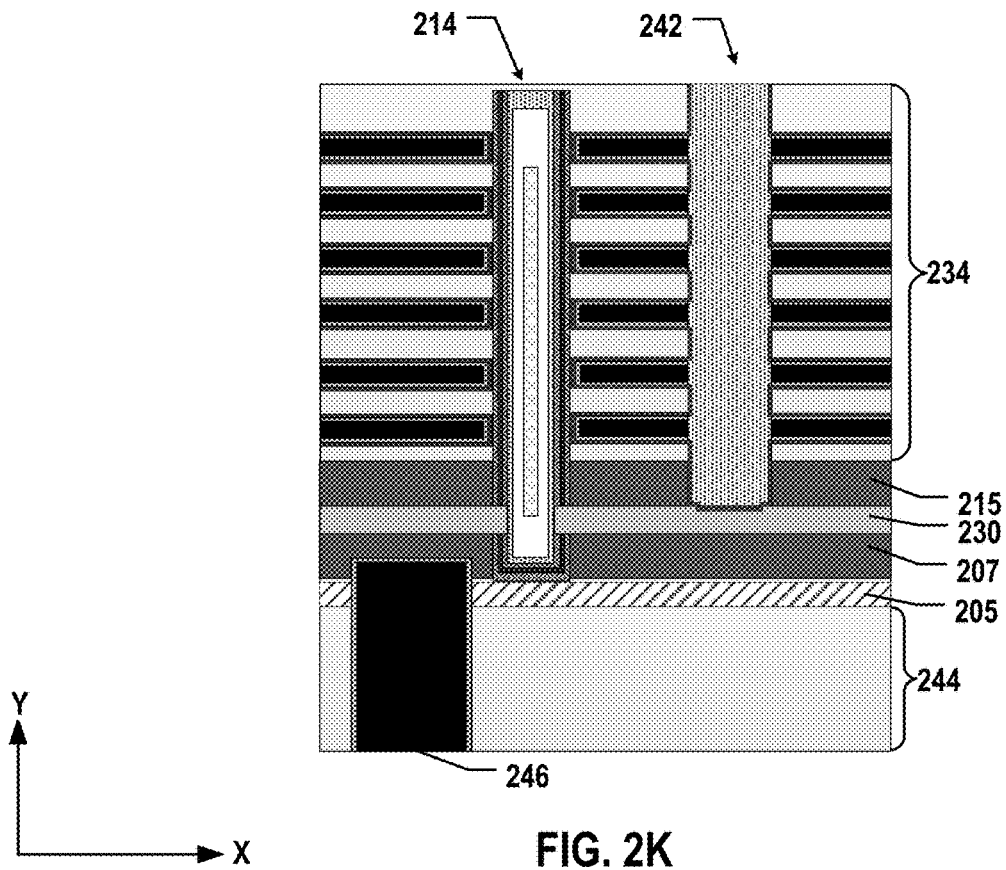

As illustrated in FIG. 2K, a backside source contact structure 246 is formed extending vertically through dielectric layer 244 and second stop layer 205 to be in contact with first polysilicon layer 207. In some embodiments, source contact structure 246 is formed by first etching an opening extending vertically through dielectric layer 244 and second stop layer 205 into first polysilicon layer 207 using wet etching and/or dry etching, such as RIE, followed by forming an adhesion layer over the sidewall and the bottom surface of the opening, for example, by depositing TiN using one or more thin film deposition processes, such as PVD, CVD, ALD, or any combinations thereof. Source contact structure 246 then can be formed by forming a conductive layer over the adhesion layer, for example, by depositing a metal (e.g., W) using one or more thin film deposition processes, such as PVD, CVD, ALD, electroplating, electroless plating, or any combinations thereof.

It is understood in some examples different from operation 416 in FIG. 4, the stop layer may be removed after removing the substrate, such that the source contact structure extends vertically through the dielectric layer, not but the stop layer, to be in contact with the first polysilicon layer. In some embodiments, the stop layer is removed after removing the substrate, a dielectric layer is formed in contact with the first polysilicon layer, and a source contact structure extending vertically through the dielectric layer is formed to be in contact with the first polysilicon layer.

Figure 2L:
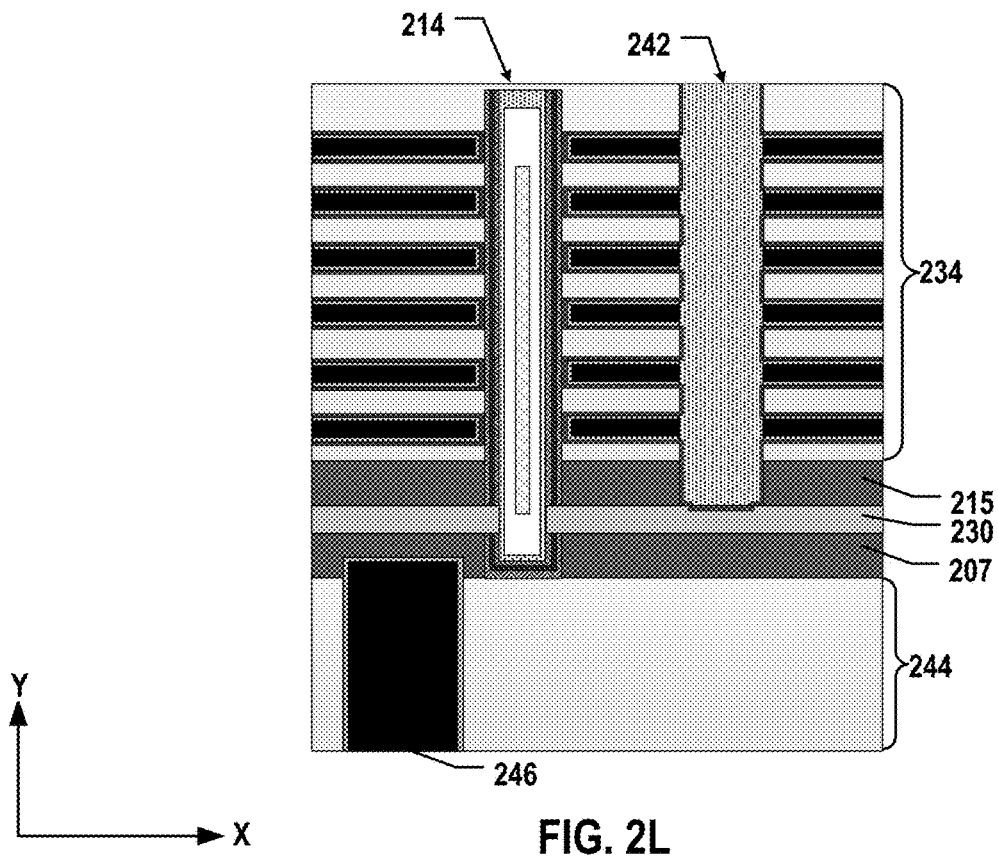

As illustrated in FIG. 2L, both first and second stop layers 203 and 205 are removed using wet etching and/or dry etching to expose first polysilicon layer 207. Dielectric layer 244 can be formed on first polysilicon layer 207 by depositing dielectric materials, such as silicon oxide, on top of first polysilicon layer 207 using one or more thin film deposition processes, such as PVD, CVD, ALD, or any combinations thereof.

As illustrated in FIG. 2L, backside source contact structure 246 is formed extending vertically through dielectric layer 244 to be in contact with first polysilicon layer 207. In some embodiments, source contact structure 246 is formed by first etching an opening extending vertically through dielectric layer 244 into first polysilicon layer 207 using wet etching and/or dry etching, such as RIE, followed by forming an adhesion layer over the sidewall and the bottom surface of the opening, for example, by depositing TiN using one or more thin film deposition processes, such as PVD, CVD, ALD, or any combinations thereof. Source contact structure 246 then can be formed by forming a conductive layer over the adhesion layer, for example, by depositing a metal (e.g., W) using one or more thin film deposition processes, such as PVD, CVD, ALD, electroplating, electroless plating, or any combinations thereof.

Although now shown, it is understood that in some examples, prior to removing the substrate, a front side source contact structure may be formed in the opening, e.g., slit 224, by depositing one or more conductive materials in the opening using one or more thin film deposition processes, such as PVD, CVD, ALD, or any combinations thereof. The front side source contact structure may replace the backside source contact structure, e.g., source contact structure 246, and the front side insulating structure, e.g., insulating structure 242.

Figure 5:
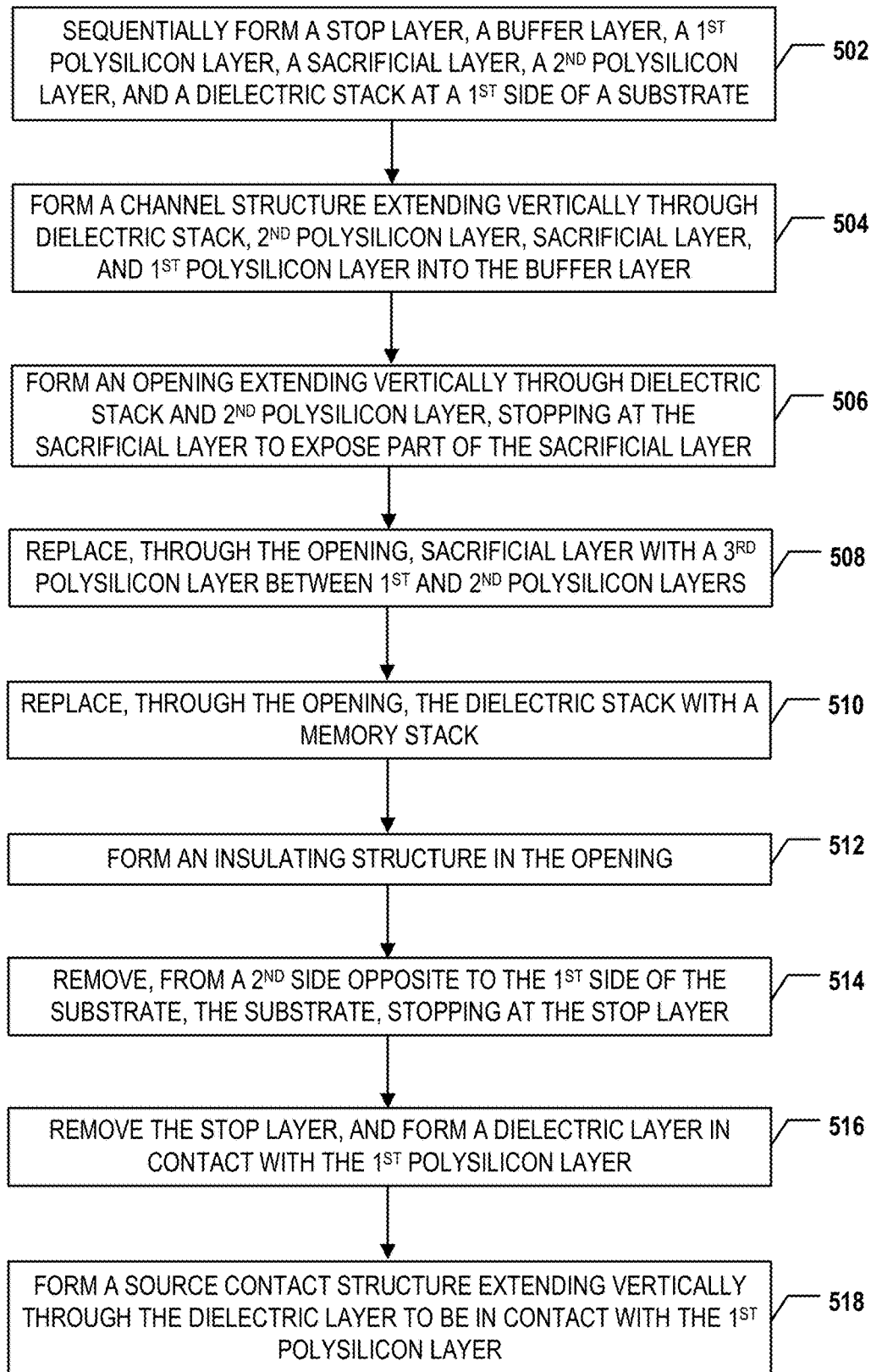
FIG. 5 illustrates a flowchart of a method for forming another exemplary 3D memory device, according to some embodiments of the present disclosure.

FIGS. 3A-3J illustrate a fabrication process for forming another exemplary 3D memory device, according to some embodiments of the present disclosure. FIG. 5 illustrates a flowchart of a method 500 for forming another exemplary 3D memory device, according to some embodiments of the present disclosure. Examples of the 3D memory device depicted in FIGS. 3A-3J and 5 include 3D memory device 130 depicted in FIG. 1C. FIGS. 3A-3J and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a stop layer, a buffer layer, a first polysilicon layer, a sacrificial layer, a second polysilicon layer, and a dielectric stack are sequentially formed at a first side of a substrate. The substrate can be a silicon substrate or a carrier substrate, made of any suitable materials, such as glass, sapphire, plastic, to name a few, to reduce the cost of the substrate. The first side can be the front side of the substrate on which semiconductor devices can be formed. In some embodiments, the stop layer includes silicon nitride, and the buffer layer includes silicon oxide. In some embodiments, to form the sacrificial layer, a first sacrificial layer, a second sacrificial layer, and a third sacrificial layer are sequentially formed. The first sacrificial layer can include silicon oxynitride, the second sacrificial layer can include polysilicon, and the third sacrificial layer can include silicon oxynitride. The dielectric stack can include a plurality of interleaved stack sacrificial layers and stack dielectric layers.

As illustrated in FIG. 3A, a stop layer 303, a buffer layer 305, a first polysilicon layer 307, a first sacrificial layer 309, a second sacrificial layer 311, a third sacrificial layer 313, and a second polysilicon layer 315 are sequentially formed at the front side of a substrate 302. Substrate 302 can be a silicon substrate, or a carrier substrate made of any suitable materials, such as glass, sapphire, plastic, to name a few. In some embodiments, stop layer 303 and buffer layer 305 include silicon nitride and silicon oxide, respectively. As described below in detail, stop layer 303 can act as the stop layer when removing substrate 302 from the backside and thus, may include any other suitable materials other than the material of substrate 302. It is understood in some embodiments, a pad oxide layer (e.g., silicon oxide layer) may be formed between substrate 302 and stop layer 303 to relax the stress therebetween.

First, second, and third sacrificial layers 309, 311, and 313 may be collectively referred to herein as a sacrificial layer. In some embodiments, first, second, and third sacrificial layers 309, 311, and 313 include silicon oxynitride, polysilicon, and silicon oxynitride, respectively. As described below in detail, third sacrificial layer 313 can act as the stop layer when etching the slit openings from the front side and can be later selectively removed and thus, may include any other suitable materials that have a high etching selectivity (e.g., greater than about 5) with respect to polysilicon (the material of second polysilicon layer 315 on third sacrificial layer 313). Second sacrificial layer 311 can be later selectively removed and thus, may include any other suitable materials that have a high etching selectivity (e.g., greater than about 5) with respect to dielectrics, such as polysilicon or carbon. First sacrificial layer 309 can act as the stop layer when etching second sacrificial layer 311 and can be later selectively removed and thus, may include any other suitable materials that have a high etching selectivity (e.g., greater than about 5) with respect to polysilicon (the material of second sacrificial layer 311 and first polysilicon layer 307).

Stop layer 303, buffer layer 305, first polysilicon layer 307, first sacrificial layer 309, second sacrificial layer 311, third sacrificial layer 313, and second polysilicon layer 315 (or any other layers therebetween) can be formed by sequentially depositing corresponding materials in this order in multiple cycles using one or more thin film deposition processes including, but not limited to, CVD, PVD, ALD, electroplating, electroless deposition, any other suitable deposition processes, or any combination thereof. In some embodiments, at least one of first and second polysilicon layers 307 and 315 is doped with N-type dopants, such as P, As, or Sb. In one example, the at least one of first and second polysilicon layers 307 and 315 may be doped using an ion implantation process after depositing polysilicon materials. In another example, in-situ doping of N-type dopants may be performed when depositing polysilicon to form the at least one of first and second polysilicon layers 307 and 315. It is understood that in some examples, none of first and second polysilicon layers 307 and 315 is doped with N-type dopants at this stage.

As illustrated in FIG. 3A, a dielectric stack 308 including a plurality pairs of a first dielectric layer (known as a "stack sacrificial layer 312") and a second dielectric layer (known as a "stack dielectric layer 310") is formed on second polysilicon layer 315. Dielectric stack 308 includes interleaved stack sacrificial layers 312 and stack dielectric layers 310, according to some embodiments. Stack dielectric layers 310 and stack sacrificial layers 312 can be alternatively deposited on second polysilicon layer 315 to form dielectric stack 308. In some embodiments, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. In some embodiments, a pad oxide layer (e.g., silicon oxide layer, not shown) is formed between second polysilicon layer 315 and dielectric stack 308.

Method 500 proceeds to operation 504, as illustrated in FIG. 5, in which a channel structure extending vertically through the dielectric stack, the second polysilicon layer, the sacrificial layer, and the first polysilicon layer into the buffer layer is formed. In some embodiments, to form the channel structure, a channel hole extending vertically through the dielectric stack, the second polysilicon layer, the sacrificial layer, and the first polysilicon layer into the buffer layer is formed, and a memory film and a semiconductor channel are sequentially formed along a sidewall of the channel hole. In some embodiments, a channel plug is formed above and in contact with the semiconductor channel.

As illustrated in FIG. 3A, a channel hole is an opening extending vertically through dielectric stack 308, second polysilicon layer 315, sacrificial layers 313, 311, and 309, and first polysilicon layer 307 into buffer layer 305. In some embodiments, a plurality of openings are formed, such that each opening becomes the location for growing an individual channel structure 314 in the later process. In some embodiments, fabrication processes for forming the channel hole of channel structure 314 include wet etching and/or dry etching processes, such as DRIE. The etching of the channel hole may not stop at the bottom surface of first polysilicon layer 307 and extend further into buffer layer 305 with various depths, i.e., gouging variation. That is, buffer layer 305 can accommodate the gouging variation between channel holes to ensure that each channel hole extends through first polysilicon layer 307.

As illustrated in FIG. 3A, a memory film 316 (including a blocking layer, a storage layer, and a tunneling layer) and a semiconductor channel 318 are sequentially formed in this order along sidewalls and the bottom surface of the channel hole. In some embodiments, memory film 316 is first deposited along the sidewalls and bottom surface of the channel hole, and semiconductor channel 318 is then deposited over memory film 316. The blocking layer, storage layer, and tunneling layer can be subsequently deposited in this order using one or more thin film deposition processes, such as ALD, CVD, PVD, any other suitable processes, or any combination thereof, to form memory film 316. Semiconductor channel 318 can then be formed by depositing a semiconductor material, such as polysilicon, over the tunneling layer of memory film 316 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 316 and semiconductor channel 218.

As illustrated in FIG. 3A, a capping layer 320 is formed in the channel hole and over semiconductor channel 318 to completely or partially fill the channel hole (e.g., without or with an air gap). Capping layer 320 can be formed by depositing a dielectric material, such as silicon oxide, using one or more thin film deposition processes, such as ALD, CVD, PVD, any other suitable processes, or any combination thereof. A channel plug 322 then can be formed in the upper portion of the channel hole. In some embodiments, parts of memory film 316, semiconductor channel 318, and capping layer 320 that are on the top surface of dielectric stack 308 are removed and planarized by CMP, wet etch, and/or dry etch processes. A recess then can be formed in the upper portion of the channel hole by wet etching and/or drying etching parts of semiconductor channel 318 and capping layer 320 in the upper portion of the channel hole. Channel plug 322 then can be formed by depositing semiconductor materials, such as polysilicon, into the recess by one or more thin film deposition processes, such as CVD, PVD, ALD, or any combination thereof. Channel structure 314 is thereby formed through dielectric stack 308, second polysilicon layer 315, sacrificial layers 313, 311, and 309, and first polysilicon layer 307 into buffer layer 305, according to some embodiments.

Method 500 proceeds to operation 506, as illustrated in FIG. 5, in which an opening extending vertically through the dielectric stack and the second polysilicon layer, stopping at the sacrificial layer is formed to expose part of the sacrificial layer. In some embodiments, forming the opening is stopped at the third sacrificial layer.

As illustrated in FIG. 3B, a slit 324 is an opening formed that extends vertically through dielectric stack 308 and second polysilicon layer 315, stopping at third sacrificial layer 313, which exposes part of third sacrificial layer 313. In some embodiments, fabrication processes for forming slit 324 include wet etch and/or dry etch processes, such as DRIE. In some embodiments, stack dielectric layers 310 and stack sacrificial layers 312 of dielectric stack 308 are first etched. The etching of dielectric stack 308 may not stop at the top surface of second polysilicon layer 315 and extend further into second polysilicon layer 315 with various depths, i.e., gouging variation. Thus, a second etching process (sometimes known as post etching treatment) can be performed to etch second polysilicon layer 315 until being stopped by third sacrificial layer 313 (e.g., a silicon oxynitride layer) due to the etching selectivity between the materials of third sacrificial layer 313 (e.g., a silicon oxynitride layer) and second polysilicon layer 315 (e.g., polysilicon).

Method 500 proceeds to operation 508, as illustrated in FIG. 5, in which the sacrificial layer is replaced, through the opening, with a third polysilicon layer between the first and second polysilicon layers. In some embodiments, to replace the sacrificial layer with the third polysilicon layer, the sacrificial layer is removed, through the opening, to form a cavity between the first and second polysilicon layers, part of the memory film is removed, through the opening, to expose part of the semiconductor channel along the sidewall of the channel hole, and polysilicon is deposited, through the opening, into the cavity to form the third polysilicon layer. In some embodiments, at least one of the first, second, and third polysilicon layers is doped with an N-type dopant. The N-type dopant can be diffused in the first, second, and third polysilicon layers.

As illustrated in FIG. 3C, a spacer 328 is formed along the sidewall of slit 324 by depositing one or more dielectrics, such as high-k dielectrics, along the sidewall of slit 324. The bottom surface of spacer 328 (and part of third sacrificial layer 313 in slit 324 if still remains) can be opened using wet etch and/or dry etch processes to expose part of second sacrificial layer 311 (shown in FIG. 3B, e.g., a polysilicon layer). In some embodiments, sacrificial layer 311 is then removed by wet etching and/or dry etching to form a cavity 326. In some embodiments, second sacrificial layer 311 includes polysilicon, spacer 328 includes a high-k dielectric, first and third sacrificial layers 309 and 303 each includes silicon oxynitride, and second sacrificial layer 311 is etched by applying TMAH etchant through slit 324, which can be stopped by the high-k dielectric of spacer 328 as well as the silicon oxynitride of first and third sacrificial layers 309 and 313. That is, the removal of second sacrificial layer 311 does not affect dielectric stack 308 and first and third polysilicon layers 307 and 315 protected by spacer 328 and first and third sacrificial layers 309 and 313, respectively, according to some embodiments.

As illustrated in FIG. 3D, part of memory film 316 exposed in cavity 326 is removed to expose part of semiconductor channel 318 along the sidewall of channel structure 314. In some embodiments, parts of the blocking layer (e.g., including silicon oxide), storage layer (e.g., including silicon nitride), and tunneling layer (e.g., including silicon oxide) are etched by applying etchants through slit 324 and cavity 326, for example, phosphoric acid for etching silicon nitride and hydrofluoric acid for etching silicon oxide. The etching can be stopped by spacer 328 and semiconductor channel 318. That is, the removal of part of memory film 316 exposed in cavity 326 does not affect dielectric stack 308 (protected by spacer 328) and semiconductor channel 318 including polysilicon and capping layer 320 enclosed by semiconductor channel 318, according to some embodiments. In some embodiments, first and third sacrificial layers 309 and 313 (including silicon oxynitride) are removed as well by the same etching process.

Figure 3E:
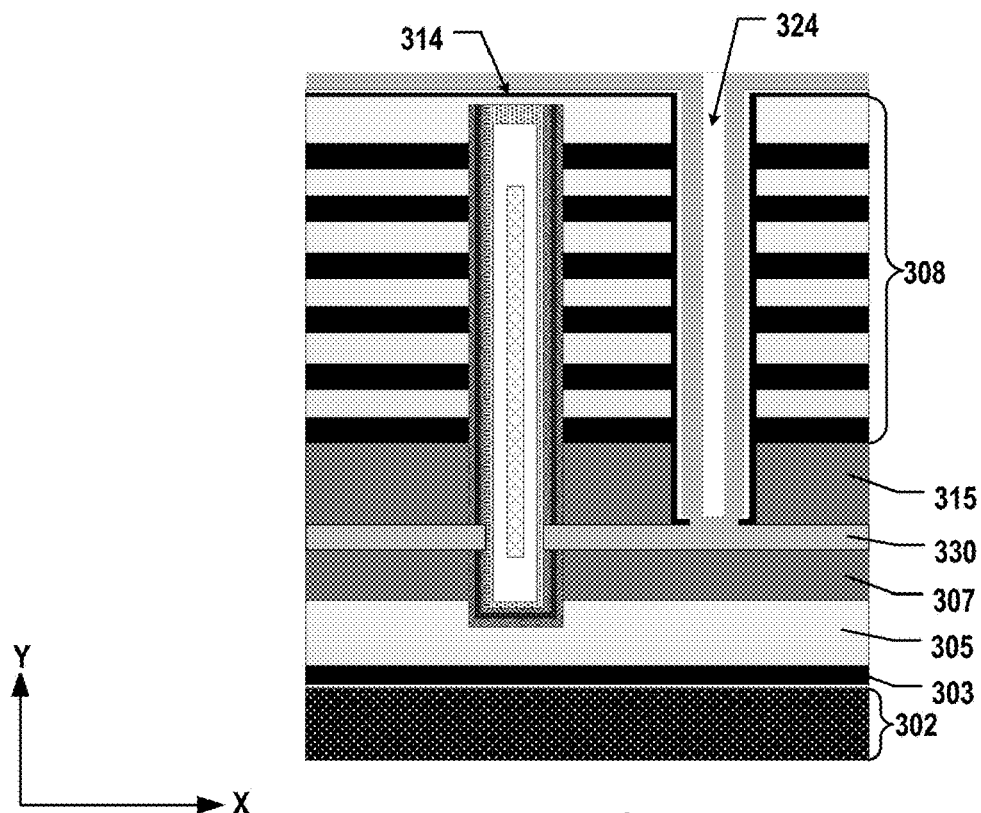

As illustrated in FIG. 3E, a third polysilicon layer 330 is formed between first and second polysilicon layers 307 and 315. In some embodiments, third polysilicon layer 330 is formed by depositing polysilicon into cavity 326 (shown in FIG. 3D) through slit 324 using one or more thin film deposition processes, such as CVD, PVD, ALD, or any combination thereof. In some embodiments, in-situ doping of N-type dopants, such as P, As, or Sb, is performed when depositing polysilicon to form third polysilicon layer 330. Third polysilicon layer 330 can fill cavity 326 to be in contact with the exposed part of semiconductor channel 318 of channel structure 314. It is understood that third polysilicon layer 330 may be doped or un-doped depending on whether at least one of first and second polysilicon layers 307 and 315 are doped with N-type dopants since at least one of first, second, and third polysilicon layers 307, 315, and 330 may need to be doped with N-type dopants. In some embodiments, the N-type dopants in at least one of first, second, and third polysilicon layers 307, 315, and 330 is diffused in first, second, and third polysilicon layers 307, 315, and 330 to achieve a uniform doping concentration profile in the vertical direction among first, second, and third polysilicon layers 307, 315, and 330 using thermal diffusion process, such as annealing. For example, the doping concentration may be between $10^{19}$ cm$^{-3}$ and $10^{22}$ cm$^{-3}$ after diffusion. As described above, the interfaces between first, second, and third polysilicon layers 307, 315, and 330 may become indistinguishable as each of first, second, and third polysilicon layers 307, 315, and 330 includes the same polysilicon material with nominally the same doping concentration. Thus, first, second, and third polysilicon layers 307, 315, and 330 may be collectively viewed as a polysilicon layer after diffusion.

Figure 3F:
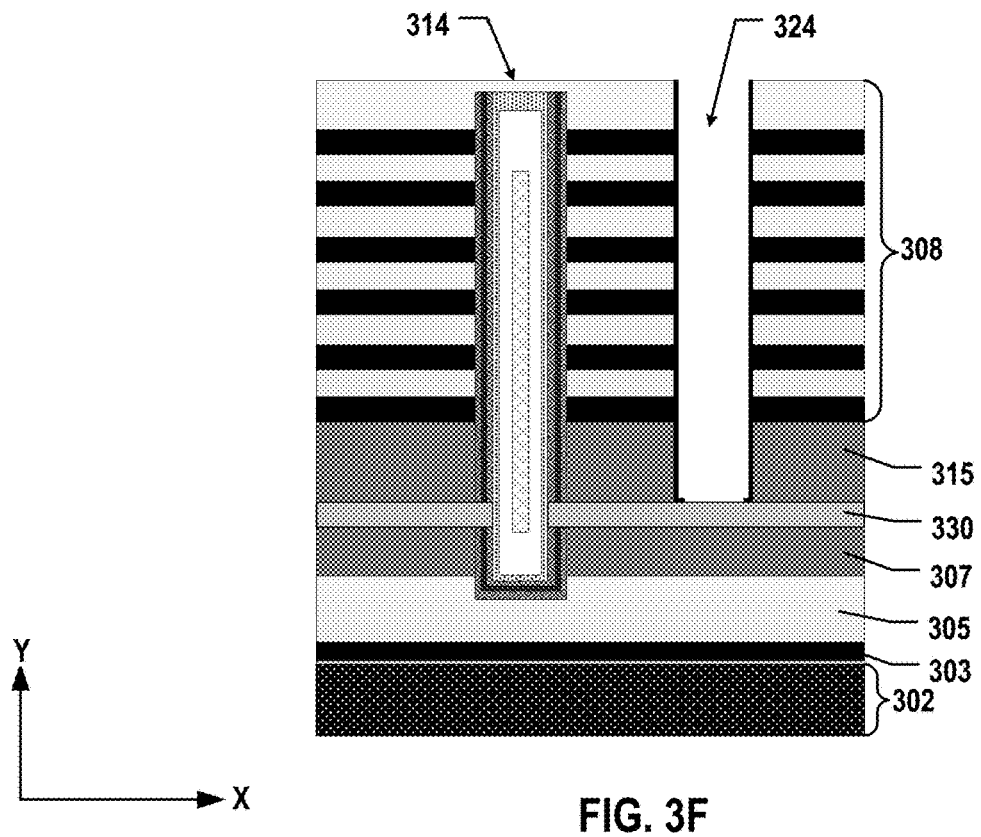

Method 500 proceeds to operation 510, as illustrated in FIG. 5, in which the dielectric stack is replaced, through the opening, with a memory stack using the so-called "gate replacement process." As illustrated in FIG. 3F, part of third polysilicon layer 330 and any remaining spacer 328 formed along the sidewall of slit 324 (shown in FIG. 3E) are removed using wet etching and/or dry etching to expose stack sacrificial layers 312 of dielectric stack 308 through slit 324. The etching process can be controlled (e.g., by controlling the etching rate and/or time), such that third polysilicon layer 330 still remains between first and second polysilicon layers 307 and 315 and in contact with semiconductor channel 318 of channel structure 314.

Figure 3G:
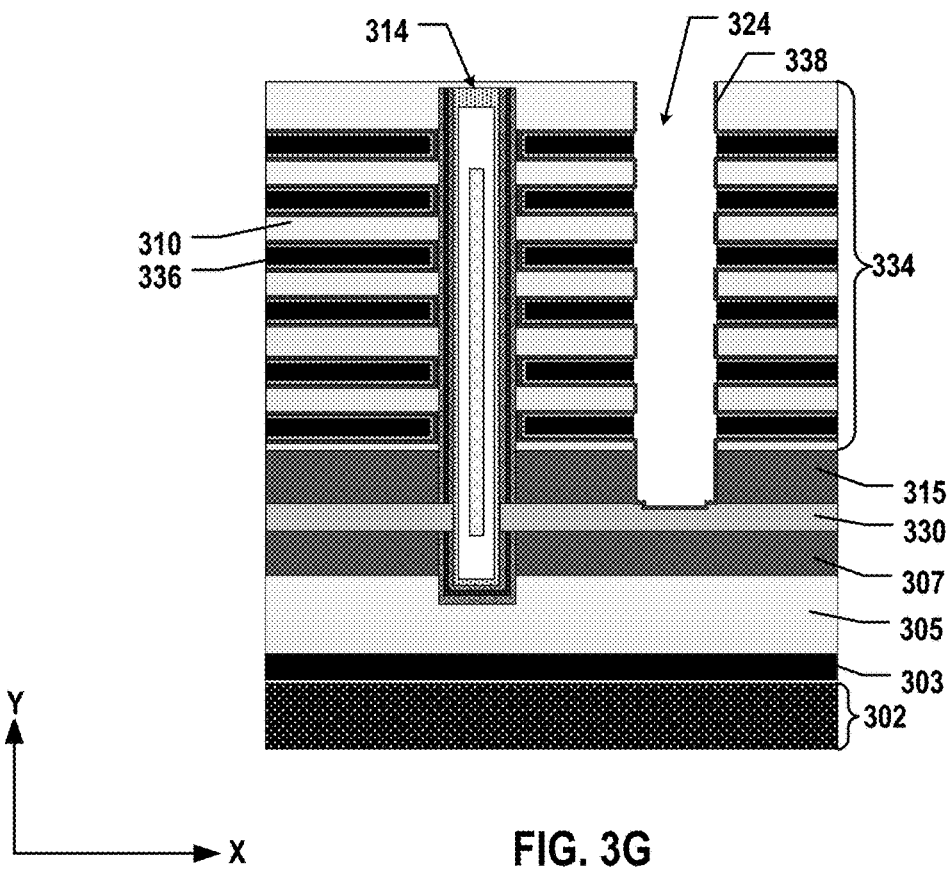

As illustrated in FIG. 3G, a memory stack 334 can be formed by a gate replacement process, i.e., replacing stack sacrificial layers 312 with stack conductive layers 336. Memory stack 334 thus can include interleaved stack conductive layers 336 and stack dielectric layers 310 on second polysilicon layer 315. In some embodiments, to form memory stack 334, stack sacrificial layers 312 are removed by applying etchants through slit 324 to form a plurality of lateral recesses. Stack conductive layers 336 then can be deposited into the lateral recesses by depositing one or more conductive materials using one or more thin film deposition processes, such as PVD, CVD, ALD, or any combinations thereof. Channel structure 314 thereby extends vertically through memory stack 334 and the polysilicon layer including first, third, and second polysilicon layers 315, 330, and 307 into buffer layer 305, according to some embodiments.

Figure 3H:
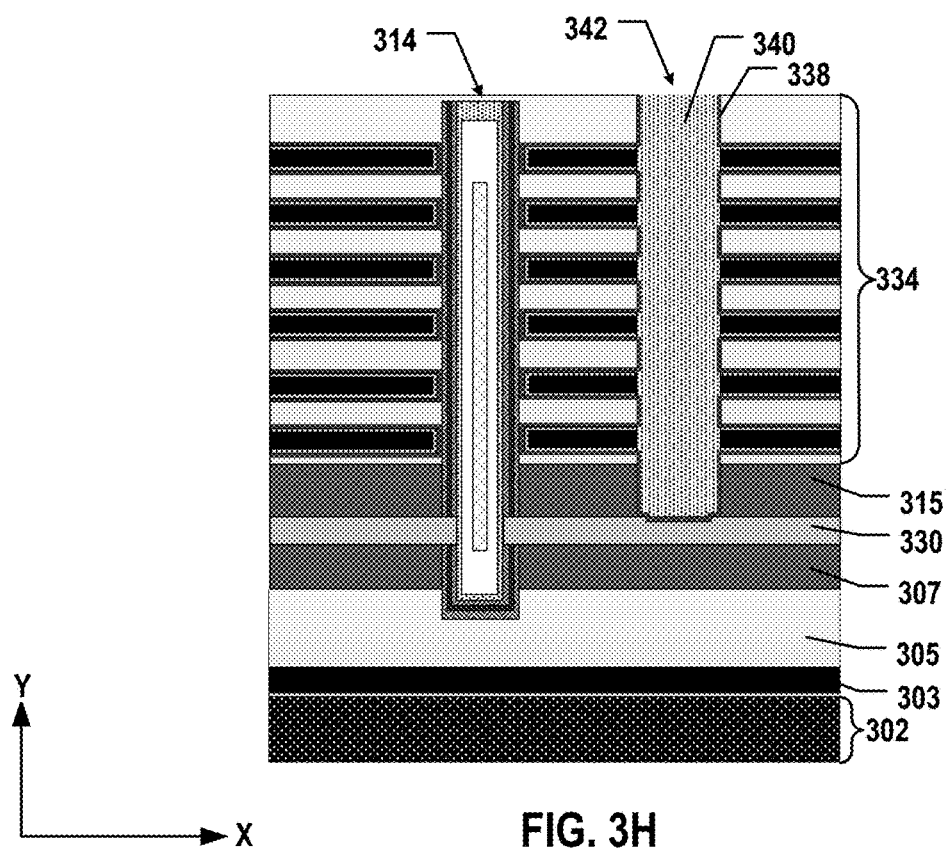

Method 500 proceeds to operation 512, as illustrated in FIG. 5, in which an insulating structure is formed in the opening. In some embodiments, to form the insulating structure, one or more dielectric materials are deposited into the opening to fill the opening. As illustrated in FIG. 3H, an insulating structure 342 is formed in slit 324 (shown in FIG. 3G). Insulating structure 342 can be formed by depositing one or more dielectric materials, such as high-k dielectrics (also as a gate dielectric layer 338) and silicon oxide as an insulating core 340, in slit 324 to completely or partially fill slit 324 with or without air gap using one or more thin film deposition processes, such as PVD, CVD, ALD, or any combinations thereof.

Figure 3I:
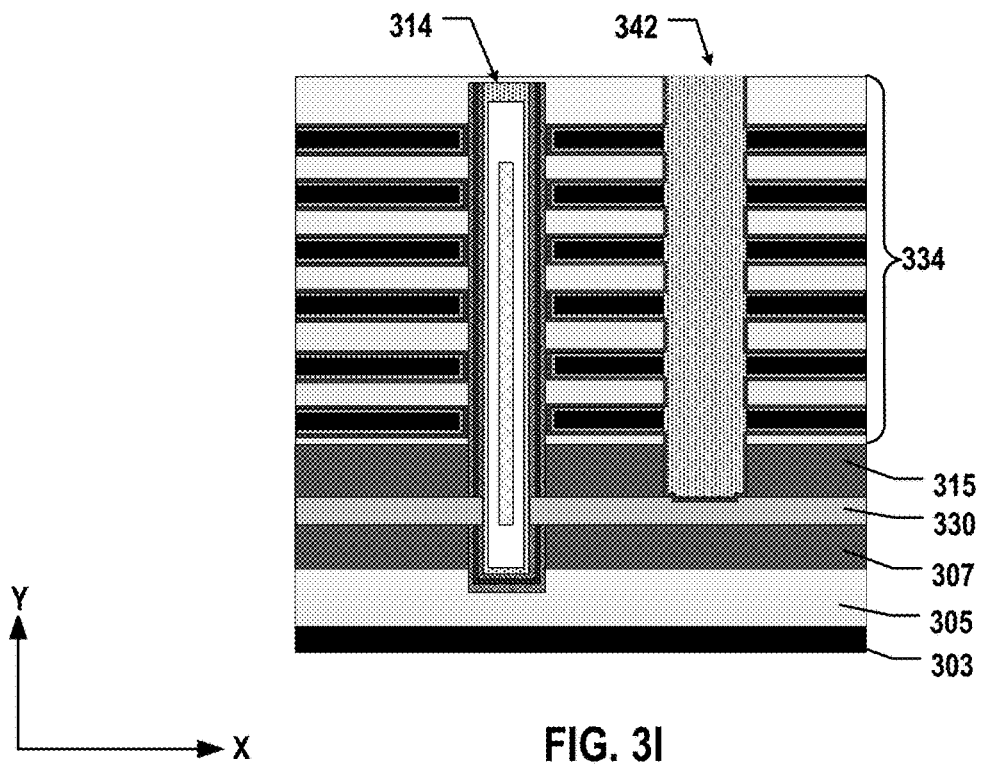

Method 500 proceeds to operation 514, as illustrated in FIG. 5, in which the substrate is removed, from a second side opposite to the first side of the substrate, stopping at the stop layer. The second side can be the backside of the substrate. As illustrated in FIG. 3I, substrate 302 (shown in FIG. 3H) is removed from the backside. Although not shown in FIG. 3I, it is understood that the intermediate structure in FIG. 3H may be flipped upside down to have substrate 302 on the top of the intermediate structure. In some embodiments, substrate 302 is completely removed using CMP, grinding, wet etching, and/or dry etching until being stopped by stop layer 303 (e.g., a silicon nitride layer). In some embodiments, substrate 302 (a silicon substrate) is removed using silicon CMP, which is automatically stopped when reaching stop layer 303 having materials other than silicon, i.e., acting as a backside CMP stop layer. In some embodiments, substrate 302 (a silicon substrate) is removed using wet etching by TMAH, which is automatically stopped when reaching stop layer 303 having materials other than silicon, i.e., acting as a backside etch stop layer. Stop layer 303 can ensure the complete removal of substrate 302 without the concern of thickness uniformity after thinning.

Figure 3J:
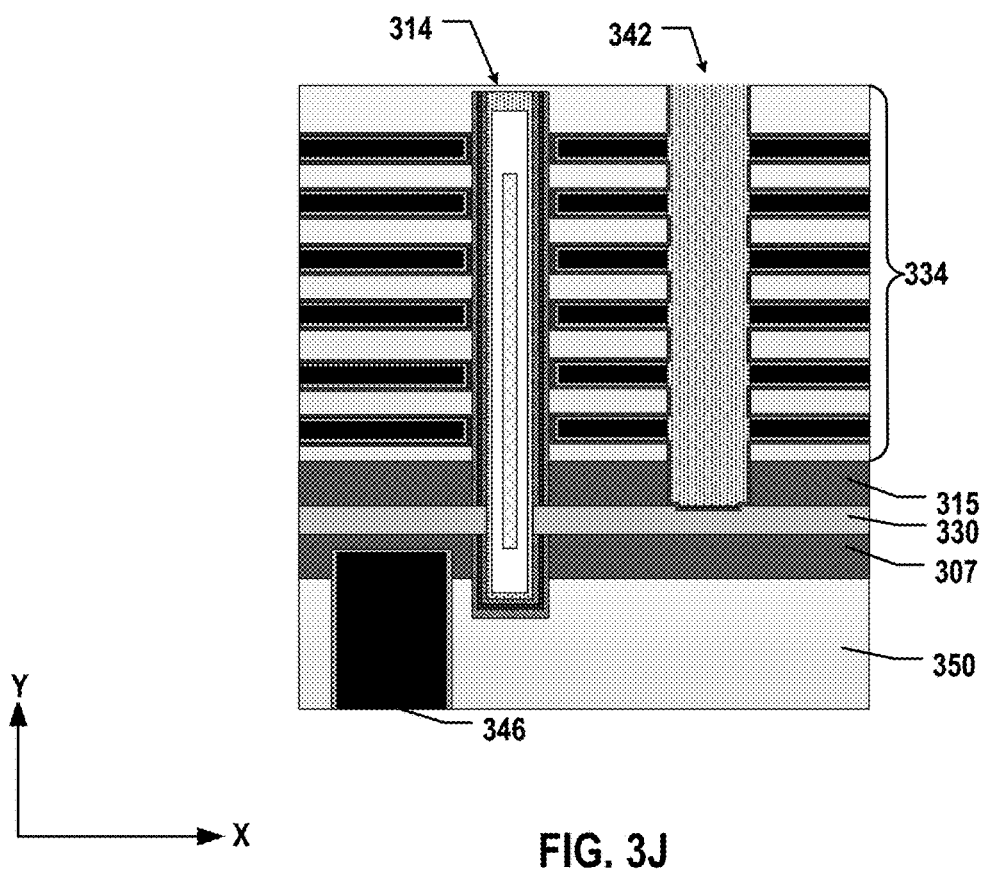

Method 500 proceeds to operation 516, as illustrated in FIG. 5, in which the stop layer is removed, and a dielectric layer is formed in contact with the first polysilicon layer. As illustrated in FIG. 3J, stop layer 303 is removed using wet etching and/or dry etching to expose buffer layer 305. Dielectric layer 350 can be formed on buffer layer 305 by depositing dielectric materials, such as silicon oxide, on top of buffer layer 305 using one or more thin film deposition processes, such as PVD, CVD, ALD, or any combinations thereof. In some embodiments in which buffer layer 305 includes the same material as dielectric layer 350, such as silicon oxide, buffer layer 305 becomes part of dielectric layer 350 in contact with first polysilicon layer 307. In some embodiments, no additional dielectric layer is formed, and buffer layer 305 itself becomes dielectric layer 350 in contact with first polysilicon layer 307.

Method 500 proceeds to operation 518, as illustrated in FIG. 5, in which a source contact structure extending vertically through the dielectric layer is formed to be in contact with the first polysilicon layer. As illustrated in FIG. 3J, a backside source contact structure 346 is formed extending vertically through dielectric layer 350 to be in contact with first polysilicon layer 307. In some embodiments, source contact structure 346 is formed by first etching an opening extending vertically through dielectric layer 350 into first polysilicon layer 307 using wet etching and/or dry etching, such as RIE, followed by forming an adhesion layer over the sidewall and the bottom surface of the opening, for example, by depositing TiN using one or more thin film deposition processes, such as PVD, CVD, ALD, or any combinations thereof. Source contact structure 346 then can be formed by forming a conductive layer over the adhesion layer, for example, by depositing a metal (e.g., W) using one or more thin film deposition processes, such as PVD, CVD, ALD, electroplating, electroless plating, or any combinations thereof.

Although now shown, it is understood that in some examples, prior to removing the substrate, a front side source contact structure may be formed in the opening, e.g., slit 324, by depositing one or more conductive materials in the opening using one or more thin film deposition processes, such as PVD, CVD, ALD, or any combinations thereof. The front side source contact structure may replace the backside source contact structure, e.g., source contact structure 346, and the front side insulating structure, e.g., insulating structure 342.

According to one aspect of the present disclosure, a 3D memory device includes a stop layer, a polysilicon layer, a memory stack including interleaved stack conductive layers and stack dielectric layers, and a plurality of channel structures each extending vertically through the memory stack and the polysilicon layer, stopping at the stop layer.

In some embodiments, the 3D memory device further includes a dielectric layer at an opposite side of the polysilicon layer with respect to the stop layer and in contact with the stop layer.

In some embodiments, the 3D memory device further includes a source contact structure extending vertically through the dielectric layer and the stop layer from the opposite side of the polysilicon layer with respect to the stop layer to be in contact with the polysilicon layer.

In some embodiments, the 3D memory device further includes an insulating structure extending vertically through the memory stack into the polysilicon layer.

In some embodiments, the 3D memory device further includes a source contact structure extending vertically through the memory stack into the polysilicon layer.

In some embodiments, each of the plurality of channel structures includes a memory film and a semiconductor channel, and part of the semiconductor channel along a sidewall of the channel structure is in contact with a sublayer of the polysilicon layer.

In some embodiments, the insulating structure or the source contact structure stops at the sublayer of the polysilicon layer.

In some embodiments, the stop layer includes a high-k dielectric layer.

In some embodiments, the polysilicon layer includes an N-type doped polysilicon layer. In some embodiments, a doping concentration of the N-type doped polysilicon layer is between about $10^{19}$ cm$^{-3}$ and about $10^{22}$ cm$^{-3}$.

In some embodiments, each of the plurality of channel structures is not in contact with a single crystalline silicon layer.

In some embodiments, the stop layer is above the polysilicon layer.

According to another aspect of the present disclosure, a 3D memory device includes a polysilicon layer, a memory stack including interleaved stack conductive layers and stack dielectric layers, and a plurality of channel structures each extending vertically through the memory stack and the polysilicon layer. Each of the plurality of channel structures includes a memory film and a semiconductor channel Part of the semiconductor channel along a sidewall of the channel structure is in contact with a sublayer of the polysilicon layer. The 3D memory device further includes an insulating structure extending vertically through the memory stack into the polysilicon layer, stopping at the sublayer of the polysilicon layer.

In some embodiments, the 3D memory device further includes a dielectric layer at an opposite side of the memory stack with respect to the polysilicon layer and in contact with the polysilicon layer.

In some embodiments, each of the plurality of channel structures stops at the dielectric layer.

In some embodiments, each of the plurality of channel structures extends further into the dielectric layer.

In some embodiments, the 3D memory device further includes a source contact structure extending vertically through the dielectric layer from the opposite side of the memory stack with respect to the polysilicon layer to be in contact with the polysilicon layer.

In some embodiments, the polysilicon layer includes an N-type doped polysilicon layer. In some embodiments, a doping concentration of the N-type doped polysilicon layer is between about $10^{19}$ cm$^{-3}$ and about $10^{22}$ cm$^{-3}$.

In some embodiments, the insulating structure is filled with one or more dielectric materials.

In some embodiments, each of the plurality of channel structures is not in contact with a single crystalline silicon layer.

According to still another aspect of the present disclosure, a 3D memory device includes a polysilicon layer, a memory stack including interleaved stack conductive layers and stack dielectric layers, and a plurality of channel structures each extending vertically through the memory stack and the polysilicon layer. Each of the plurality of channel structures includes a memory film and a semiconductor channel Part of the semiconductor channel along a sidewall of the channel structure is in contact with a sublayer of the polysilicon layer. The 3D memory device further includes a source contact structure extending vertically through the memory stack into the polysilicon layer, stopping at the sublayer of the polysilicon layer.

In some embodiments, the 3D memory device further includes a dielectric layer at an opposite side of the memory stack with respect to the polysilicon layer and in contact with the polysilicon layer.

In some embodiments, each of the plurality of channel structures stops at the dielectric layer.

In some embodiments, each of the plurality of channel structures extends further into the dielectric layer.

In some embodiments, the polysilicon layer includes an N-type doped polysilicon layer. In some embodiments, a doping concentration of the N-type doped polysilicon layer is between about $10^{19}$ cm$^{-3}$ and about $10^{22}$ cm$^{-3}$.

In some embodiments, the source contact structure includes a conductor in contact with the polysilicon layer and a spacer laterally between the conductor and the stack conductive layers of the memory stack.

In some embodiments, each of the plurality of channel structures is not in contact with a single crystalline silicon layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a stop layer comprising a dielectric material;
a polysilicon layer at a first side of the stop layer and being in contact with the dielectric material of the stop layer;
a dielectric layer isolated from the polysilicon layer by the stop layer and in contact with a second side of the stop layer;
a source contact structure extending vertically through the dielectric layer and the stop layer from the second side of the stop layer, and extending into the polysilicon layer and without penetrating through the polysilicon layer;
a memory stack comprising interleaved stack conductive layers and stack dielectric layers; and
a plurality of channel structures each extending vertically through the memory stack and the polysilicon layer, stopping at the stop layer.

2. The 3D memory device of claim 1, wherein the polysilicon layer comprises an upper sublayer in contact with the memory stack, a lower sublayer in contact with the stop layer, and an intermediate sublayer between the upper sublayer and the lower sublayer.

3. The 3D memory device of claim 2, further comprising an insulating wall structure extending vertically through the memory stack into the polysilicon layer and laterally through the memory stack.

4. The 3D memory device of claim 3, wherein the insulating wall structure stops at the intermediate sublayer of the polysilicon layer.

5. The 3D memory device of claim 3, wherein the insulating wall structure extends through the upper sublayer of the polysilicon layer and stops in the intermediate sublayer of the polysilicon layer.

6. The 3D memory device of claim 3, wherein the insulating wall structure comprises:
an insulator core in contact with the stack conductive layers; and
and a high-k dielectric layer between the insulator core and the stack dielectric layers.

7. The 3D memory device of claim 2, wherein each of the plurality of channel structures comprises a memory film and a semiconductor channel, and part of the semiconductor channel along a sidewall of the channel structure is in contact with the intermediate sublayer of the polysilicon layer.

8. The 3D memory device of claim 7, wherein the memory film is discontinued at a position of the intermediate sublayer of the polysilicon layer in a vertical direction.

9. The 3D memory device of claim 2, wherein the source contact structure stops in the lower sublayer of the polysilicon layer.

10. The 3D memory device of claim 1, wherein the stop layer comprises a high dielectric constant (high-k) dielectric layer.

11. The 3D memory device of claim 1, wherein the polysilicon layer comprises an N-type doped polysilicon layer.

12. The 3D memory device of claim 11, wherein a doping concentration of the N-type doped polysilicon layer is between about $10^{19}$ cm$^{-3}$ and about $10^{22}$ cm$^{-3}$.

13. The 3D memory device of claim 1, wherein each of the plurality of channel structures is not in contact with a single crystalline silicon layer.

14. The 3D memory device of claim 1, wherein lower ends of the plurality of channel structures are substantially flush with a top surface of the stop layer.

15. The 3D memory device of claim 1, wherein the stop layer includes a material that has an etching selectivity greater than about 5 with respect to materials in the memory stack.

16. The 3D memory device of claim 1, wherein the source contact structure includes a via contact.

17. The 3D memory device of claim 1, wherein the source contact structure includes a wall-shaped contact extending laterally.

* * * * *